US012796224B2

(12) United States Patent
Gao et al.

(10) Patent No.: US 12,796,224 B2
(45) Date of Patent: Nov. 10, 2026

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Wenhui Gao, Beijing (CN); Miao Wang, Beijing (CN); Cong Liu, Beijing (CN); Dan Cao, Beijing (CN); Binyan Wang, Beijing (CN); Yonglin Guo, Beijing (CN); Gukhwan Song, Beijing (CN); Zhiliang Jiang, Beijing (CN); Yangpeng Wang, Beijing (CN); Ming Hu, Beijing (CN)

(73) Assignees: CHENGDU BOE OPTOELECTRONICS TECHNOLOGY CO., LTD., Chengdu (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 396 days.

(21) Appl. No.: 18/697,409

(22) PCT Filed: Jul. 31, 2023

(86) PCT No.: PCT/CN2023/110183

§ 371 (c)(1),
(2) Date: Mar. 29, 2024

(87) PCT Pub. No.: WO2025/025043

PCT Pub. Date: Feb. 6, 2025

(65) Prior Publication Data

US 2026/0157036 A1 Jun. 4, 2026

(51) Int. Cl.

*H10K 59/131* (2023.01)
*H10K 59/121* (2023.01)
*G09G 3/3225* (2016.01)

(52) U.S. Cl.

CPC ....... *H10K 59/1213* (2023.02); *H10K 59/131* (2023.02); *G09G 3/3225* (2013.01); (Continued)

(58) Field of Classification Search

CPC . H10K 59/1213; H10K 59/131; G09G 3/3225
See application file for complete search history.

(56) References Cited

U.S. PATENT DOCUMENTS 11,226,527 B2 * 1/2022 Ryu .................. G02F 1/134309
12,531,019 B2 * 1/2026 Cao ...................... G09G 3/3225
2023/0165076 A1 * 5/2023 Han ..................... G09G 3/3233
257/72

* cited by examiner

*Primary Examiner* — Dale E Page
*Assistant Examiner* — Wilner Jean Baptiste
(74) *Attorney, Agent, or Firm* — BROOKS KUSHMAN P.C.

(57) ABSTRACT

A display substrate includes a base substrate, a plurality of sub-pixels and a first scanning line, the subpixel includes a subpixel driving circuit including a driving transistor and a compensation transistor, a gate electrode of the compensation transistor is coupled to a corresponding first scanning line, a first/second electrode of the compensation transistor is coupled to a second/gate electrode of the driving transistor, the compensation transistor includes a compensation active layer including a first channel portion, a second channel portion and a first conductor portion, the first conductor portion is respectively coupled to the first channel portion and the second channel portion; at least part of an orthographic projection of the first conductor portion on the base substrate is located between an orthographic projection of the first scanning line on the base substrate and the (Continued)

orthographic projection of the gate electrode of the driving transistor on the base substrate.

20 Claims, 21 Drawing Sheets

(52) U.S. Cl.
CPC ............... *G09G 2300/0426* (2013.01); *G09G 2300/0452* (2013.01); *G09G 2300/0819* (2013.01); *G09G 2300/0842* (2013.01); *G09G 2300/0861* (2013.01); *G09G 2310/08* (2013.01)

DISPLAY SUBSTRATE AND DISPLAY DEVICE

CROSS-REFERENCE TO RELATED APPLICATION

This application is the U.S. national phase of PCT Application No. PCT/CN2023/110183 filed on Jul. 31, 2023, which is incorporated herein by reference in its entirety.

TECHNICAL FIELD

The present disclosure relates to the field of display technology, in particular to a display substrate and a display device.

BACKGROUND

With the continuous development of display technology, demand and expectations for smart terminal display devices are getting higher and higher in the current market, and the average daily use time and frequency of smart terminal display devices are also getting higher and higher. Currently, display technologies adopted in smart terminal display devices mainly include liquid crystal display technology, organic light emitting diode display technology, etc. The organic light emitting diode display technology can achieve beneficial effects such as fast response speed, wide display viewing angle, thinness and lightness. Therefore, organic light emitting diode display technology is increasingly used in smart terminal display devices.

SUMMARY

In one aspect, the present disclosure aims to provide a display substrate and a display device.

In order to achieve the objective, the present disclosure provides the following technical solution.

In a first aspect, an embodiment of the present disclosure provides a display substrate including a base substrate, a plurality of sub-pixels and a first scanning line both arranged on the base substrate, wherein the first scanning line includes at least part extending along a first direction, and the subpixel includes a subpixel driving circuit including a driving transistor and a compensation transistor, a gate electrode of the compensation transistor is coupled to a corresponding first scanning line, a first electrode of the compensation transistor is coupled to a second electrode of the driving transistor, a second electrode of the compensation transistor is coupled to a gate electrode of the driving transistor; the compensation transistor includes a compensation active layer, the compensation active layer includes a first channel portion, a second channel portion and a first conductor portion, the first conductor portion is respectively coupled to the first channel portion and the second channel portion; at least part of an orthographic projection of the first conductor portion on the base substrate is located between an orthographic projection of the first scanning line on the base substrate and the orthographic projection of the gate electrode of the driving transistor on the base substrate.

Optionally, the compensation transistor includes a first compensation gate electrode and a second compensation gate electrode, an orthographic projection of the first compensation gate electrode on the base substrate covers the orthographic projection of the first channel portion on the base substrate, an orthographic projection of the second compensation gate electrode on the base substrate covers the orthographic projection of the second channel portion on the base substrate; the first compensation gate electrode is coupled to the corresponding first scanning line, and at least part of the first compensation gate electrode is located between the first scanning line to which the first compensation gate electrode is coupled and the gate electrode of the driving transistors, the first scanning line is multiplexed as the second compensation gate electrode.

Optionally, the display substrate further includes a data line and a second scanning line, the second scanning line includes at least part extending along the first direction, the sub-pixel driving circuit further includes a data writing-in transistor, a gate electrode of the data writing-in transistor is coupled to a corresponding second scanning line, a first electrode of the data writing-in transistor is coupled to a corresponding data line, and a second electrode of the data writing-in transistor is coupled to the first electrode of the driving transistor; in a same sub-pixel, the gate electrode of the data writing-in transistor is located on a side of the first scanning line facing the gate electrode of the driving transistor.

Optionally, the data writing-in transistor includes a data active layer, and the gate electrode of the data writing-in transistor includes a gate body portion and a gate extension portion coupled to each other, an orthographic projection of the gate body portion on the base substrate at least partially overlaps an orthographic projection of the data active layer on the base substrate, the gate extension portion is coupled to the corresponding second scanning line; the gate body portion and the gate electrode of the driving transistor are arranged along the first direction, and at least part of the gate extension portion and the gate electrode of the driving transistor are arranged along a second direction, and the first direction intersects the second direction; the gate body portion and the gate extension portion are arranged in a same layer or in different layers.

Optionally, the sub-pixel driving circuit further includes a first conductive connection portion and a first reset transistor, and a first end of the conductive connection portion is coupled to the gate electrode of the driving transistor, and a second end of the first conductive connection portion is coupled to the second electrode of the first reset transistor; the second scanning line is at least partially arranged around the second end of the first conductive connection portion.

Optionally, the gate electrode of the data writing-in transistor and the first scanning line are arranged in a same layer and made of a same material, and the second scanning line and the first scanning line are arranged in different layers, the second scanning line and the first conductive connection portion are arranged in a same layer and made of a same material.

Optionally, the second scanning line includes a plurality of straight edge portions and a plurality of curved edge portions, the straight edge portion and the curved edge portion are arranged alternately along the first direction, the curved edge portion is arranged around the second end of the first conductive connection portion, the straight edge portion includes a protruding end, at least part of an orthographic projection of the protruding end on the base substrate and the orthographic projection of the gate electrode of the driving transistor on the base substrate are arranged along the second direction, and the protruding end is coupled to the gate electrode of the data writing-in transistor.

Optionally, the display substrate further includes a first initialization signal line, the first initialization signal line includes at least part extending along the second direction; the first electrode of the first reset transistor is coupled to the first initialization signal line; the orthographic projection of the first initialization signal line on the base substrate is located between the orthographic projection of the gate electrode of the driving transistor on the base substrate and the orthographic projection of the data line on the base substrate.

Optionally, the display substrate further includes a power line, the first initialization signal line, the power line and the data line are arranged in a same layer and made of a same material, and the first initialization signal line is located between the power line and the data line.

Optionally, the display substrate further includes a second initialization signal line, a third initialization signal line and a third scanning line, the third scanning line includes at least part extending along the first direction; the sub-pixel also includes a light emitting element; the sub-pixel driving circuit also includes a second reset transistor and a third reset transistor, a gate electrode of the second reset transistor and a gate electrode of the third reset transistor are both coupled to a corresponding same third scanning line; a first electrode of the second reset transistor is coupled to the second initialization signal line, a second electrode of the second reset transistor is coupled with an anode of the light emitting element; a first electrode of the third reset transistor is coupled to the third initialization signal line, a second electrode of the third reset transistor is coupled to the first electrode of the driving transistor.

Optionally, the second scanning line and the first scanning line are arranged in different layers, and the orthographic projection of the second scanning line on the base substrate at least partially overlaps the orthographic projection of the first scanning line on the base substrate; the display substrate includes a second gate metal layer and a first source-drain metal layer, the second initialization signal line and the first source-drain metal layer are arranged in a same layer and made of a same material, and the third initialization signal line and the second gate metal layer are arranged in a same layer and made of a same material.

Optionally, the display substrate further includes a power line; the first reset transistor includes a first reset active layer, and the first reset active layer includes a third channel portion, a fourth channel portion and a second conductor portion, the second conductor portion is coupled to the third channel portion and the fourth channel portion respectively; an orthographic projection of the second conductor portion on the base substrate at least partially overlaps an orthographic projection of the second initialization signal line on the base substrate; and/or the orthographic projection of the second conductor portion on the base substrate at least partially overlaps an orthographic projection of the third initialization signal line on the base substrate; and/or the orthographic projection of the second conductor portion on the base substrate at least partially overlaps an orthographic projection of the power line on the base substrate.

Optionally, the display substrate further includes a power line and a first conductive connection portion, a first end of the first conductive connection portion is coupled to the gate electrode of the driving transistor, and a second end of the first conductive connection portion is coupled to the second electrode of the compensation transistor; the sub-pixel driving circuit also includes a storage capacitor, and a first electrode plate of the storage capacitor is coupled to the gate electrode of the driving transistor, and a second electrode plate of the storage capacitor is coupled to the corresponding power line; the compensation active layer further includes a conductor extension portion coupled to the first conductor portion, and an orthographic projection of the conductor extension portion on the base substrate at least partially overlaps an orthographic projection of the second electrode plate on the base substrate; and/or, an orthographic projection of the first conductor portion on the base substrate does not overlap an orthographic projection of the first conductive connection portion on the base substrate; and/or, the orthographic projection of the second electrode plate on the base substrate at least partially overlaps the orthographic projection of the first conductor portion on the base substrate.

Optionally, the display substrate further includes a light-shielding layer, and an orthographic projection of the light-shielding layer on the base substrate at least partially overlaps the orthographic projection of the active layer of the driving transistor on the base substrate, at least partially overlaps the orthographic projection of the compensation active layer on the base substrate.

Optionally, the sub-pixel further includes a light emitting element, and the light emitting element includes an anode; the sub-pixel driving circuit also includes a light emitting control transistor and the second conductive connection portion, a first electrode of the light emitting control transistor is coupled to the second electrode of the driving transistor, a first end of the second conductive connection portion is connected to a second electrode of the light emitting control transistor, and a second end of the second conductive connection portion is coupled to the anode through a first via hole; the sub-pixel further includes a pixel opening area, and an orthographic projection of the pixel opening area on the base substrate does not overlap an orthographic projection of the first via on the base substrate.

Optionally, the sub-pixels further include a light emitting element, and the light emitting element includes an anode; the anode of at least part of the sub-pixels includes an anode body portion and an anode dummy portion; an orthographic projection of the anode body portion on the base substrate at least partially overlaps an orthographic projection of the compensation active layer included in the sub-pixel to which the anode body portion belong on the base substrate; an orthographic projection of the anode dummy portion on the base substrate at least partially overlaps the orthographic projection of the compensation active layer included in the sub-pixel adjacent to the anode dummy portion along the first direction on the base substrate.

Optionally, the display substrate includes red sub-pixels, green sub-pixels and blue sub-pixels; at least part of the sub-pixels include red sub-pixels and blue sub-pixels, and adjacent sub-pixels include green sub-pixels.

In a second aspect, an embodiment of the present disclosure provides a display substrate, including: a base substrate and a plurality of sub-pixels, a second scanning line, and a data line all arranged on the base substrate; wherein the second scanning line includes at least part extending along a first direction, the sub-pixel includes a sub-pixel driving circuit, the sub-pixel driving circuit includes a first conductive connection portion, a driving transistor, a compensation transistor and a data writing-in transistor; a first electrode of the compensation transistor is coupled to a second electrode of the driving transistor, and a second electrode of the compensation transistor is coupled to a gate electrode of the driving transistor through the first conductive connection portion; the compensation transistor includes a compensation active layer, the compensation active layer includes a first channel portion, a second channel portion, and a first conductor portion, the first conductor portion is coupled to the first channel portion and the second channel portion, respectively; at least part of an orthographic projection of the first conductor portion on the base substrate is located between an orthographic projection of the second scanning line on the base substrate and an orthographic projections of the gate electrode of the driving transistor on the base substrate; a gate electrode of the data writing-in transistor is coupled to a corresponding second scanning line, a first electrode of the data writing-in transistor is coupled to a corresponding data line, and a second electrode of the data writing-in transistor is coupled to the first electrode of the driving transistor; at least part of the second scanning line is arranged around one end of the first conductive connection portion.

Optionally, the display substrate further includes a power line; the sub-pixel driving circuit further includes a storage capacitor, a first electrode plate of the storage capacitor is coupled to the gate electrode of the driving transistor, and a second electrode plate of the storage capacitor is coupled to the corresponding power line; an orthographic projection of the second electrode plate on the base substrate at least partially overlaps an orthographic projection of the first conductor portion on the base substrate; and/or, the orthographic projection of the first conductor portion on the base substrate at least partially overlaps an orthographic projection of the first conductive connection portion on the base substrate.

Optionally, the display substrate further includes a power line; the sub-pixel driving circuit further includes a storage capacitor, a first electrode plate of the storage capacitor is coupled to the gate electrode of the driving transistor, and a second electrode plate of the storage capacitor is coupled to the corresponding power line; an orthographic projection of the second electrode plate on the base substrate at least partially overlaps an orthographic projection of the first conductor portion on the base substrate; and/or, the orthographic projection of the first conductor portion on the base substrate does not overlap an orthographic projection of the first conductive connection portion on the base substrate; and/or, the orthographic projection of the first conductor portion on the base substrate at least partially overlaps an orthographic projection of the power line on the base substrate.

In a third aspect, an embodiment of the present disclosure provides a display device, including the display substrate.

BRIEF DESCRIPTION OF THE DRAWINGS

The drawings described here are configured to provide a further understanding of the present disclosure and constitute a part of the present disclosure. The illustrative embodiments of the present disclosure and their descriptions are configured to explain the present disclosure and do not constitute an improper limitation of the present disclosure.

DETAILED DESCRIPTION

In order to further explain the display substrate and display device provided by the embodiments of the present disclosure, a detailed description will be given below with reference to the accompanying drawings.

The present disclosure provides a display substrate. The display substrate includes a plurality of sub-pixels. The sub-pixels include a sub-pixel driving circuit and a light emitting element. The sub-pixel driving circuit adopts an 8T1C (i.e., 8 transistors and 1 storage capacitor) circuit, the transistors in the sub-pixel driving circuit all use low-temperature polysilicon transistors.

Figure 19:
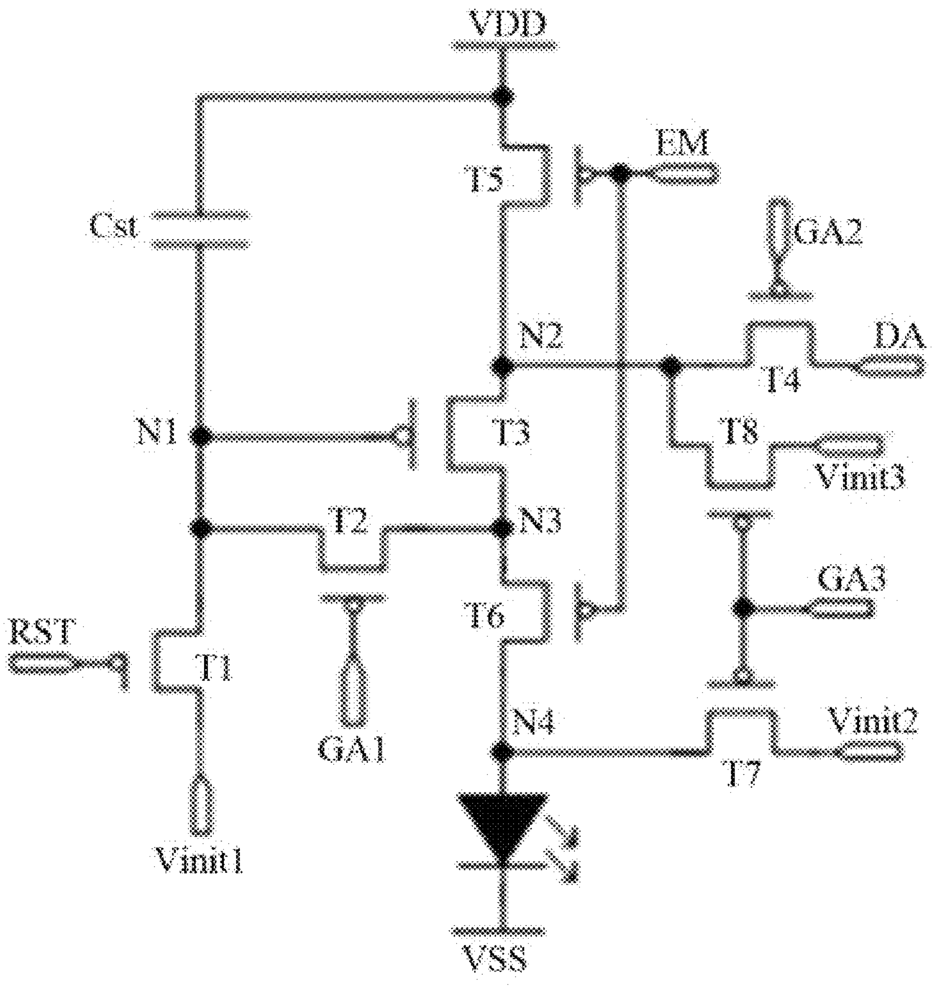
FIG. 19 is a circuit principle diagram of a sub-pixel driving circuit according to an embodiment of the present disclosure.

As shown in FIG. 19, the display substrate also includes a power line VDD, a light emitting control signal line EM, a data line DA, a first scanning line GA1, a second scanning line GA2, a third scanning line GA3, and a first initialization signal line Vinit1, a second initialization signal line Vinit2, a third initialization signal line Vinit3 and a reset signal line RST. The sub-pixel driving circuit includes a first transistor T1, a second transistor T2, a third transistor T3, a fourth transistor T4, a fifth transistor T5, a sixth transistor T6, a seventh transistor T7, an eighth transistor T8 and a storage capacitor Cst.

The gate electrode of the first transistor T1 is coupled to the corresponding reset signal line RST, the first electrode of the first transistor T1 is coupled to the first initialization signal line Vinit1, and the second electrode of the first transistor T1 is coupled to the gate electrode of the third transistor T3 (i.e., the N1 node).

The gate electrode of the second transistor T2 is coupled to the corresponding first scanning line GA1, and the first electrode of the second transistor T2 is coupled to the second electrode of the third transistor T3, the second electrode of the second transistor T2 is coupled to the gate electrode of the third transistor T3.

The gate electrode of the fourth transistor T4 is coupled to the corresponding second scanning line GA2, the first electrode of the fourth transistor T4 is coupled to the corresponding data line DA, and the second electrode of the fourth transistor T4 is coupled to the first electrode of the third transistor T3 (i.e., the N2 node).

The gate electrode of the fifth transistor T5 is coupled to the corresponding light emitting control signal line EM, the first electrode of the fifth transistor T5 is coupled to the power line VDD, and the second electrode of the fifth transistor T5 is coupled to the first electrode of the third transistor T3.

The gate electrode of the sixth transistor T6 is coupled to the corresponding light emitting control signal line EM, and the first electrode of the sixth transistor T6 is coupled to the second electrode (i.e., N3 node) of the third transistor T3, the second electrode of the sixth transistor T6 is coupled to the anode Ano (i.e., the N4 node) of the light emitting element, and the cathode of the light emitting element is connected to the negative power signal VSS.

The gate electrode of the seventh transistor T7 is coupled to the corresponding third scanning line GA3, the first electrode of the seventh transistor T7 is coupled to the second initialization signal line Vinit2, and the second electrode of the seventh transistor T7 is coupled to the anode Ano of the light emitting element.

The gate electrode of the eighth transistor T8 is coupled to the corresponding third scanning line GA3, the first electrode of the eighth transistor T8 is coupled to the third initialization signal line Vinit3, and the second electrode of the eighth transistor T8 is coupled to the first electrode of the third transistor T3.

The first electrode plate Cst1 of the storage capacitor Cst is coupled to the gate electrode of the third transistor T3, and the second electrode plate Cst2 of the storage capacitor Cst is coupled to the power line VDD. For example, the gate electrode of the third transistor T3 is multiplexed as the first electrode plate Cst1.

Figure 20:
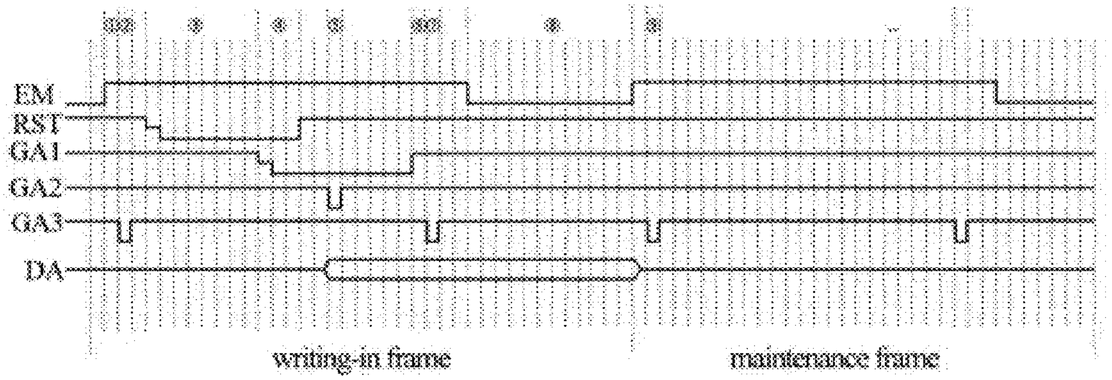
FIG. 20 is a driving timing diagram of a sub-pixel driving circuit according to an embodiment of the present disclosure.

As shown in FIGS. 19 and 20, the display substrate includes multiple driving cycles. Each driving cycle includes a writing-in frame and a maintenance frame. The working process of the sub-pixel driving circuit in each driving cycle is as follows.

In a writing-in frame, at time P1 (i.e., circle 1 in FIG. 2), the light emitting control signal transmitted by the light emitting control signal line EM is set to high level, the fifth transistor T5 and the sixth transistor T6 are both turned off, and the N1 node, N2 node, N3 nodes are all in floating state. At time P2 (i.e., circle 2 in FIG. 2), the third scanning signal transmitted by the third scanning line GA3 is set to low level, the seventh transistor T7 and the eighth transistor T8 are both turned on, and the third initialization signal transmitted by the third initialization signal line Vinit3 refresh the initial Bias of a new frame on the N2 node, and at the same time, the second initialization signal transmitted by the second initialization signal line Vinit2 resets the N4 node in time. At time P3 (i.e., circle 3 in FIG. 2), the reset signal transmitted by the reset signal line RST is set to low level, the first transistor T1 is turned on, and the first initialization signal transmitted by the first initialization signal line Vinit1 initializes the N1 node. At time P4 (i.e., circle 4 in FIG. 2), the first scanning signal transmitted by the first scanning line GA1 is set to low level, the first transistor T1 and the second transistor T2 are turned on at the same time, and the first initialization signal transmitted by the first initialization signal line Vinit1 initializes the N1 node and completes the initialization of all three nodes in the floating state. At time P5 (i.e., circle 5 in FIG. 2), the second scanning signal transmitted by the second scanning line GA2 is set to low level, the fourth transistor T4 is turned on, and a new frame of data signal is written. At time P5-P6 (i.e., circles 5 and 6 in FIG. 2), the threshold voltage Vth of the third transistor T3 is compensated through the data signal information stored in the N2 node and the parasitic capacitance. At time P6, the first scanning signal transmitted by the first scanning line GA1 is set to high level, the second transistor T2 is turned off, and the writing is completed. At time P7 (i.e., circle 7 in FIG. 2), the third scanning signal transmitted by the third scanning line GA3 is set to low level again, and the N2 node and N4 node are reset and refreshed again before emitting light to maintain the source electrode and the drain electrode of the third transistor T3 are in the same state before writing a new frame. At time P8 (i.e., circle 8 in FIG. 2), the light emitting control signal transmitted by the light emitting control signal line EM is set to low level, the fifth transistor T5 and the sixth transistor T6 are turned on, and the light emitting element is charged and turns on to emit light during the writing-in frame. In the low-frequency display maintenance frame, at time P9 and P10 (i.e., circles 9 and 10 in FIG. 2), the third scanning signal transmitted by the third scanning line GA3 is set to low level, and both the seventh transistor T7 and the eighth transistor T8 are turned on, the Bias of the N2 node can be refreshed and the N4 node can be reset.

Exemplarily, the reset signal line RST coupled to the sub-pixel driving circuit is provided with a signal by a group of light emitting control shift register units (EM GOA), for example: the signal transmitted by the reset signal line RST coupled to the nth row of sub-pixel driving circuit is provided by the (n−7)th row EM GOA. The signals transmitted by the second scanning line GA2 and the third scanning line GA3 may be provided by independent gate shift register units (Gate GOA), but are not limited to this.

In the sub-pixel driving circuit of the above structure, an eighth transistor T8 and a third initialization signal line Vinit3 are added, and the voltage of N2 node is refreshed through timing control, which can realize low-frequency and low-power consumption display and improve the low-frequency flicker problem.

While consumers are pursuing low frequency, low power consumption, and reduced low-frequency flicker, they also hope for higher-resolution display products. Due to the size of the display product, the layout space of sub-pixels is greatly limited. Therefore, it is necessary to consider the working principle, working status, possible defects of each signal line, etc., and arrange the design reasonably to avoid defects.

Figure 2:
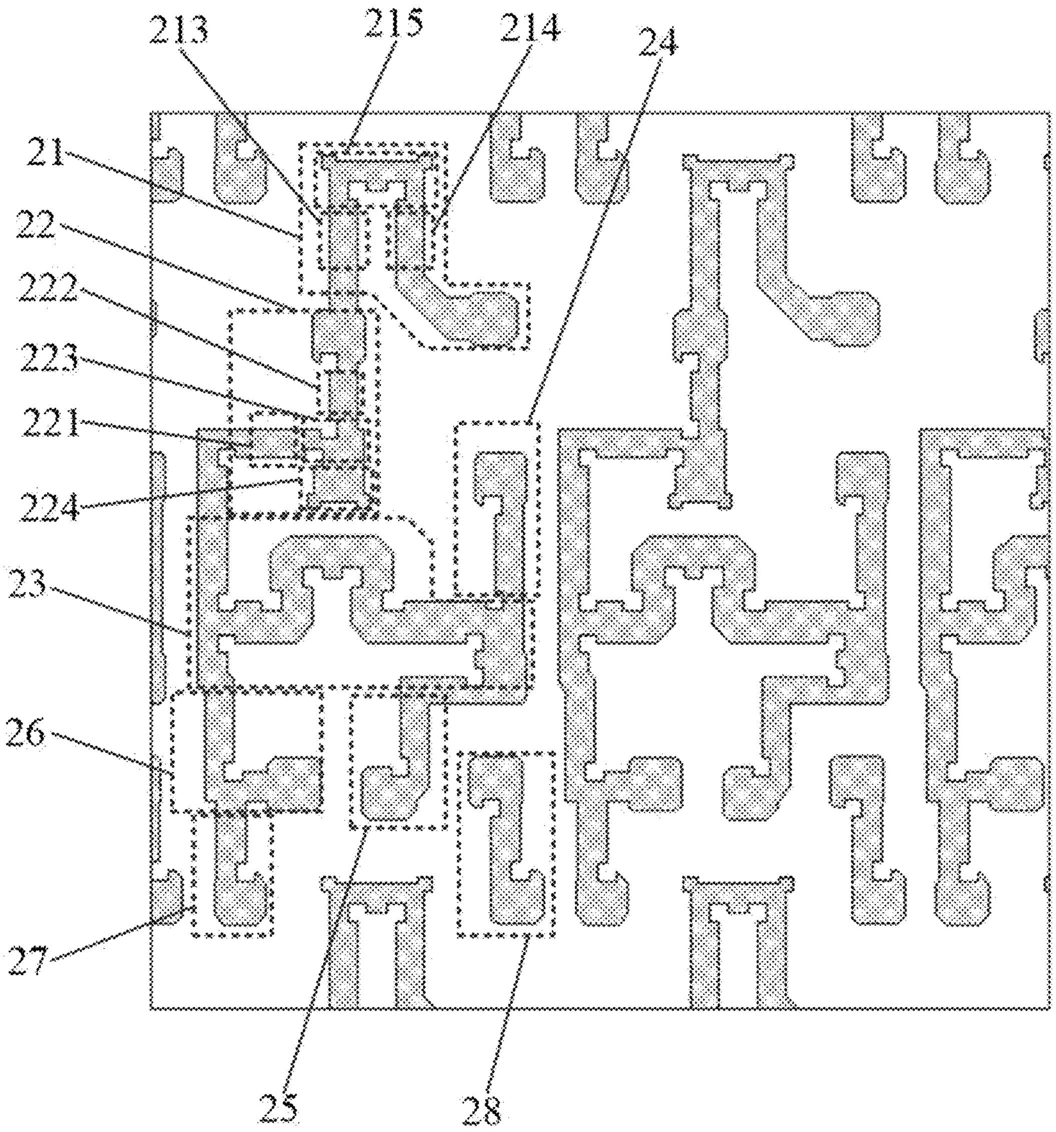
FIG. 2 is a schematic diagram of the layout of the active layer of a display substrate according to an embodiment of the present disclosure.
Figure 3:
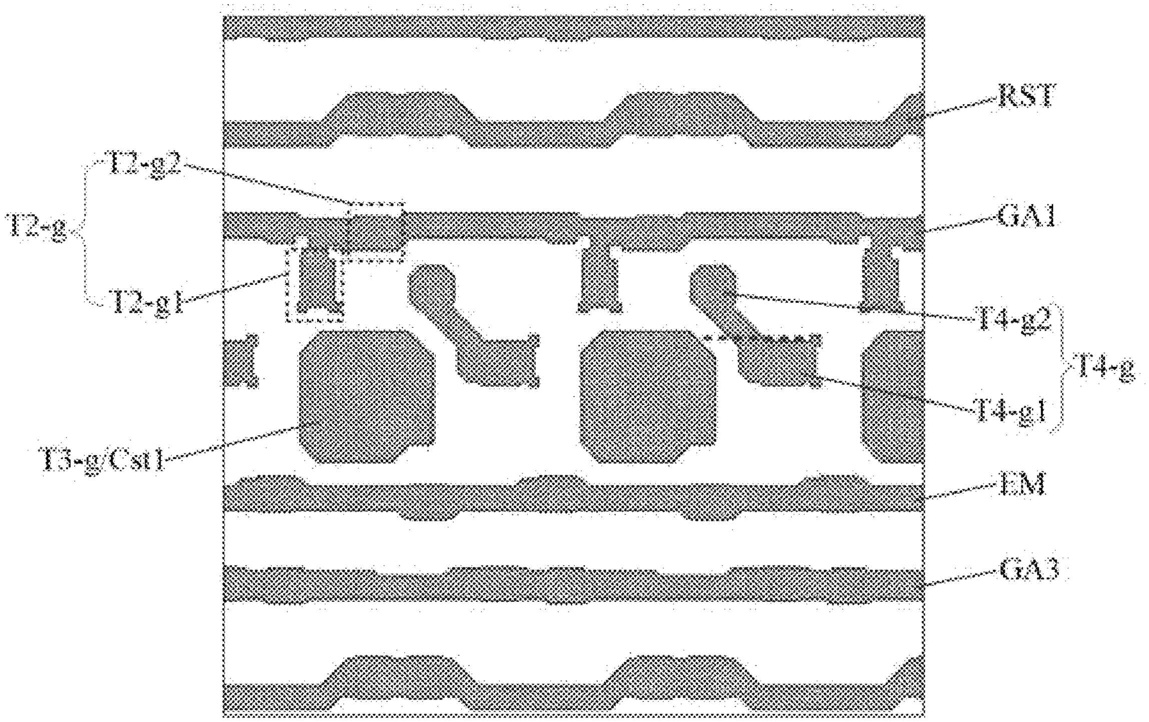
FIG. 3 is a schematic diagram of the layout of the first gate metal layer of the display substrate according to an embodiment of the present disclosure.
Figure 4:
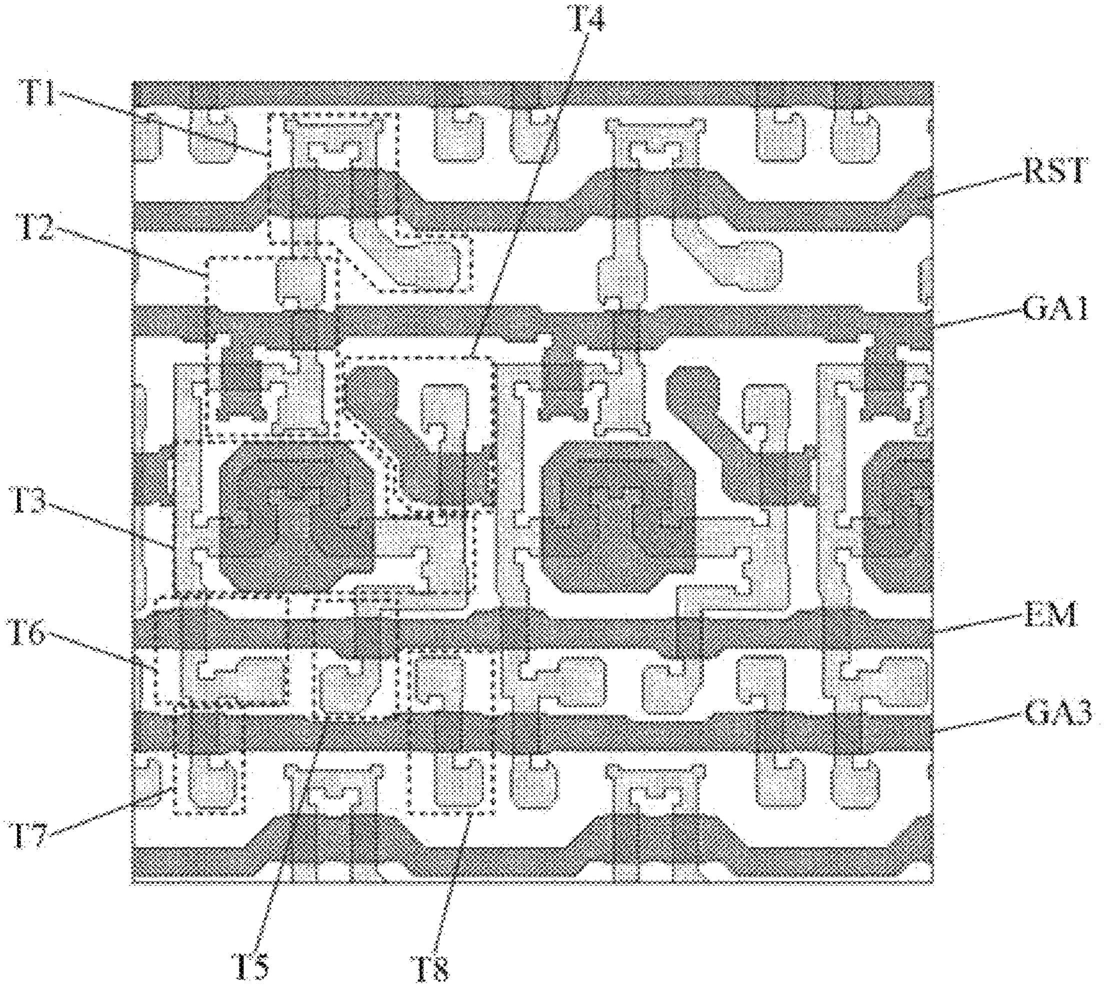
FIG. 4 is a schematic diagram of the layout of the active layer and the first gate metal layer of the display substrate according to an embodiment of the present disclosure.

Referring to FIGS. 2 to 4, embodiments of the present disclosure provide a display substrate, including: a base substrate, a plurality of sub-pixels and a first scanning line GA1 both arranged on the base substrate, the first scanning line GA1 includes at least a portion extending along the first direction, and the subpixel includes a subpixel driving circuit including a driving transistor (i.e., the third transistor T3) and a compensation transistor (i.e., the second transistor T2), the gate electrode T2-*g* of the compensation transistor is coupled to the corresponding first scanning line GA1, the first electrode of the compensation transistor is coupled to the second electrode of the driving transistor, the second electrode of the compensation transistor is coupled to the gate electrode T3-*g* of the driving transistor;

The compensation transistor includes a compensation active layer 22. The compensation active layer 22 includes a first channel portion 221, a second channel portion 222 and a first conductor portion 223. The first conductor portion 223 is respectively coupled to the first channel portion 221 and the second channel portion 222; at least part of the orthographic projection of the first conductor portion 223 on the base substrate is located between the orthographic projection of the first scanning line GA1 on the base substrate and the orthographic projection of the gate electrode T3-*g* of the driving transistor on the base substrate.

Exemplarily, the display substrate includes a plurality of sub-pixels, and a plurality of sub-pixel driving circuits included in the plurality of sub-pixels are distributed in an array. The plurality of sub-pixel driving circuits are divided into a plurality of rows of sub-pixel driving circuits and a plurality of columns of sub-pixel driving circuits. The plurality of rows of sub-pixel driving circuits are arranged along the second direction, and each row of sub-pixel driving circuits includes a plurality of sub-pixel driving circuits arranged along the first direction. The plurality of columns of sub-pixel driving circuits are arranged along a first direction, and each column of sub-pixel driving circuits includes a plurality of sub-pixel driving circuits arranged along a second direction. Illustratively, the first direction and the second direction intersect. For example: the first direction includes the transverse direction, and the second direction includes the longitudinal direction.

Exemplarily, the sub-pixel includes a sub-pixel driving circuit and a light emitting element. The sub-pixel driving circuit is coupled to the anode of the light emitting element and is configured to provide a driving signal to the light emitting element and drive the light emitting element to emit light.

Exemplarily, the display substrate includes a plurality of first scanning lines GA1, the plurality of first scanning lines GA1 are arranged along the second direction, and the first scanning line GA1 includes at least part extending along the first direction. For example: the plurality of first scanning lines GA1 correspond to the plurality of rows of sub-pixel driving circuits in a one-to-one manner, and the first scanning line GA1 is coupled to the gate electrode T2- of each compensation transistor in the corresponding row of sub-pixel driving circuits.

Exemplarily, the compensation transistor includes a double-gate electrode Transistor, and the first scanning line GA1 is coupled to two gate electrodes of the compensation transistor respectively. For example: the first scanning line GA1 is multiplexed as at least one gate electrode of the compensation transistor.

Exemplarily, the compensation transistor includes a compensation active layer 22 that includes a first channel portion 221, a second channel portion 222, and a first conductor portion 223. The first conductor portion 223 is coupled to the first channel portion 221 and the second channel portion 222 respectively. For example: the first conductor portion 223, the first channel portion 221 and the second channel portion 222 are formed into an integrated structure.

Exemplarily, at least part of the orthographic projection of the first channel portion 221 on the base substrate is located between the orthographic projection of the first scanning line GA1 on the base substrate and the orthographic projection of gate electrode T3-*g* of the driving transistor on the base substrate.

Exemplarily, the first channel portion 221 and the first conductor portion 223 are arranged along the first direction, and the second channel portion 222 and the first conductor portion 223 are arranged along the second direction.

According to the specific structure of the above display substrate, it can be known that in the display substrate provided by the embodiment of the present disclosure, the compensation transistor includes a compensation active layer 22, and at least part of the orthographic projection of the first conductor portion 223 of the compensation active layer 22 on the base substrate is located between the orthographic projection of the first scanning line GA1 on the base substrate and the orthographic projection of the gate electrode T3-*g* of the driving transistor on the base substrate. Compared with the conventional layout method, the above arrangement method enables the compensation transistor to be formed into a double-gate inverted structure, that is, in the same sub-pixel driving circuit layout area, the first conductor portion 223 and the first compensation gate electrode T2-*g*1 are all arranged in the area between the first scanning line GA1 and the gate electrode T3-*g* of the driving transistor, which effectively compresses the vertical design space occupied by the sub-pixel driving circuit and is conducive to the high resolution of the display substrate.

Moreover, since the gate electrode T2-*g* of the compensation transistor is coupled to the first scanning line GA1, the first electrode of the compensation transistor is coupled to the second electrode of the driving transistor, the second electrode of the compensation transistor is coupled to the gate electrode T3-*g* of the driving transistor, that is, the compensation transistor itself is coupled to the first scanning line GA1 and the driving transistor. Therefore, at least part of the compensation active layer 22 is arranged on an area between the first scanning line GA1 and the gate electrode T3-*g* of the driving transistor, which will not cause defects due to differences in potentials therebetween.

Therefore, the display substrate provided by the embodiments of the present disclosure comprehensively considers the working principle, working status, possible defects, etc. of the sub-pixel driving circuit and signal line, and arranges the design reasonably to improve the resolution and avoid defects.

As shown in FIGS. 2 to 4, in some embodiments, the compensation transistor includes a first compensation gate electrode T2-*g*1 and a second compensation gate electrode T2-*g*2, the orthographic projection of the first compensation gate electrode T2-*g*1 on the base substrate covers the orthographic projection of the first channel portion 221 on the base substrate, the orthographic projection of the second compensation gate electrode T2-*g*2 on the base substrate covers the orthographic projection of the second channel portion 222 on the base substrate;

The first compensation gate electrode T2-*g*1 is coupled to the corresponding first scanning line GA1, and at least part of the first compensation gate electrode T2-*g*1 is located between the first scanning line GA1 to which it is coupled and the gate electrode T3-g of the driving transistors, the first scanning line GA1 is multiplexed as the second compensation gate electrode T2-g2.

Exemplarily, the first compensation gate electrode T2-g1 and the second compensation gate electrode T2-g2 are formed into an integrated structure with the first scanning line GA1 to which they are coupled.

The above arrangement enables the compensation transistor to be formed into a double-gate inverted structure, that is, in the same sub-pixel driving circuit layout area, the first conductor portion 223 and the first compensation gate electrode T2-g1 can both be arranged in an area between the first scanning line GA1 and the gate electrode T3-g of the driving transistor, which effectively compresses the vertical design space occupied by the sub-pixel driving circuit. Moreover, since the gate electrode T2-g of the compensation transistor is coupled to the first scanning line GA1, the first electrode of the compensation transistor is coupled to the second electrode of the driving transistor, the second electrode of the compensation transistor is coupled to the gate electrode T3-g of the driving transistor, that is, the compensation transistor itself is coupled to the first scanning line GA1 and the driving transistor. Therefore, at least part of the compensation active layer 22 is arranged in an area between the first scanning line GA1 and the gate electrode T3-g of the driving transistor, which will not cause defects due to differences in potentials therebetween.

As shown in FIGS. 3, 4, and 7 to 13, in some embodiments, the display substrate further includes a data line DA and a second scanning line GA2. The second scanning line GA2 includes at least part extending along the first direction, the sub-pixel driving circuit further includes a data writing-in transistor (i.e., the fourth transistor T4), the gate electrode T4-g of the data writing-in transistor is coupled to the corresponding second scanning line GA2, the first electrode of the data writing-in transistor is coupled to the corresponding data line DA, and the second electrode of the data writing-in transistor is coupled to the first electrode of the driving transistor;

As shown in FIG. 3, in the same sub-pixel, the gate electrode T4-g of the data writing-in transistor is located on a side of the first scanning line GA1 facing the gate electrode T3-g of the driving transistor.

Exemplarily, the display substrate further includes a plurality of data lines DA and a plurality of second scanning lines GA2. The plurality of data lines DA are arranged along the first direction, and the data lines DA include at least a portion extending along the second direction. The plurality of second scanning lines GA2 are arranged along the second direction, and the second scanning lines GA2 include at least parts arranged along the first direction.

Exemplarily, the plurality of data lines DA correspond to the plurality of columns of sub-pixel driving circuits in a one-to-one manner, and the data lines DA are respectively coupled to sub-pixel driving circuits in the corresponding column of sub-pixel driving circuits. The second scanning lines GA2 are respectively coupled to sub-pixel driving circuits in a corresponding row of sub-pixel driving circuits.

For example, the first scanning line GA1 and the second scanning line GA2 are independent of each other and can independently control the transmission of scanning signals. The first scanning line GA1 controls to turn on or off the compensation transistor, and the second scanning line GA2 controls to turn on or off the data writing-in transistor. Therefore, the compensation transistor and the data writing-in transistor are driven independently.

Exemplarily, the compensation transistor and the data writing-in transistor are driven independently, and the refresh rate and writing of the data signal are controlled through the data writing-in transistor. The compensation transistor is driven by a group of light emitting control shift register units (EM GOA). Since the priority level time of the scanning signal output by EM GOA is longer, the Vth sampling time can be increased, thereby improving the compensation rate and the low grayscale uniformity of the display substrate.

In the display substrate provided by the above embodiments, the compensation transistor and the data writing-in transistor can be independently controlled, thereby achieving high compensation rate and low grayscale display uniformity of the display substrate. By being arranged in the same sub-pixel, the gate electrode T4-g of the data writing-in transistor is located on the side of the first scanning line GA1 facing the gate electrode T3-g of the driving transistor, which not only avoids the problem of the layout position conflict between the gate electrode T4-g of the data writing-in transistor and the first scanning line GA1, but also effectively compresses the vertical design space occupied by the sub-pixel driving circuit, which is conducive to the development of high-resolution display substrates.

As shown in FIGS. 2 to 4, in some embodiments, the data writing-in transistor includes a data active layer 24, and the gate electrode T4-g of the data writing-in transistor includes a gate body portion T4-g1 and a gate extension portion T4-g2 coupled to each other, the orthographic projection of the gate body portion T4-g1 on the base substrate at least partially overlaps the orthographic projection of the data active layer 24 on the base substrate, the gate extension portion T4-g2 is coupled to the corresponding second scanning line GA2;

The gate body portion T4-g1 and the gate electrode T3-g of the driving transistor are arranged along the first direction, and at least part of the gate extension portion T4-g2 and the gate electrode T3-g of the driving transistor are arranged along the second direction, and the first direction intersects the second direction; the gate body portion T4-g1 and the gate extension portion T4-g2 are arranged in the same layer or in different layers.

For example, the gate extension portion T4-g2 can be used as a part of the first scanning line GA1, that is, the gate extension portion T4-g2 is located on the first source-drain metal layer, or the gate extension portion T4-g2 can also be located in other film layers, such as the second gate metal layer.

Exemplarily, the gate body portion T4-g1 and the gate extension portion T4-g2 are formed into an integrated structure. The gate body portion T4-g1 includes at least a portion extending along the first direction, and the gate extension portion T4-g2 includes at least a portion extending along a third direction, and the third direction intersects the first direction, and intersects the second direction.

For example, the orthographic projection of the gate extension portion T4-g2 on the base substrate does not overlap the orthographic projection of the data active layer 24 on the base substrate.

The above arrangement enables the gate electrode T4-g of the data writing-in transistor to be laid out around the gate electrode T3-g of the driving transistor, and can be laid out along the boundary extension direction of the gate electrode T3-g of the driving transistor, which utilizes the surrounding space of the gate electrode T3-g of the driving transistor to a maximum extend, which is conducive to the development of high-resolution display substrates.

As shown in FIG. 4, FIG. 6, FIG. 8 and FIG. 9, in some embodiments, the sub-pixel driving circuit further includes a first conductive connection portion 31 and a first reset transistor (i.e., the first transistor T1), and the first end of the conductive connection portion 31 is coupled to the gate electrode T3-*g* of the driving transistor, and the second end of the first conductive connection portion 31 is coupled to the second electrode of the first reset transistor; The second scanning line GA2 is at least partially arranged around the second end of the first conductive connection portion 31.

Exemplarily, the gate electrode T4-*g* of the data writing-in transistor and the first scanning line GA1 are arranged in the same layer and made of the same material, and the second scanning line GA2 and the first scanning line GA1 are arranged in different layers, the second scanning line GA2 and the first conductive connection portion 31 are arranged in the same layer and made of the same material. The first conductive connection portion 31 and the first source-drain metal layer in the display substrate are arranged in the same layer and made of the same material.

The above arrangement that the second scanning line GA2 at least partially surrounds the second end of the first conductive connection portion 31 allows the second scanning line GA2 to bypass the first conductive connection portion 31, which not only avoids the short circuit between the second scanning line GA2 and the first conductive connection portion 31, but also enables the second scanning line GA2 to maintain an appropriate safe distance from the first conductive connection portion, thereby preventing the transition of the scanning signal transmitted on the second scanning line GA2 from affecting the potential of the first conductive connection portion 31, ensuring the working stability and reliability of the sub-pixel driving circuit.

As shown in FIG. 4, FIG. 6, FIG. 7, FIG. 8 and FIG. 9, in some embodiments, the second scanning line GA2 includes a plurality of straight edge portions GA21 and a plurality of curved edge portions GA22. The straight edge portion GA21 and the curved edge portion GA22 are arranged alternately along the first direction. The curved edge portion GA22 is arranged around the second end of the first conductive connection portion 31. The straight edge portion GA21 includes a protruding end GA21-T. At least part of the orthographic projection of the protruding end GA21-T on the base substrate and the orthographic projection of the gate electrode T3-*g* of the driving transistor on the base substrate are arranged along the second direction, and the protruding end GA21-T is coupled to the gate electrode T4-*g* of the data writing-in transistor.

For example, the adjacent straight edge portion GA21 and the curved edge portion GA22 are coupled, and the straight edge portion GA21 and the curved edge portion GA22 are formed into an integrated structure.

For example, the curved edge portion GA22 half surrounds the second end of the first conductive connection portion 31. The straight edge portion GA21 includes at least a portion extending along the first direction. The first conductive connection portion 31 includes at least a portion extending along the second direction.

Exemplarily, at least part of the orthographic projection of the protruding end GA21-T on the base substrate is located between the orthographic projection of the curved edge portion GA22 on the base substrate and the orthographic projection of the gate electrode T3-*g* of the driving transistor on the base substrate.

Exemplarily, there is an overlapping area between the orthographic projection of the protruding end GA21-T on the base substrate and the orthographic projection of the gate extension portion T4-*g*2 on the base substrate, and the protruding end GA21-T and the gate extension portion T4-*g*2 are coupled through via holes in the overlapping area.

The above arrangement enables the curved edge portion GA22 in the second scanning line GA2 to form a similar "门" type wiring pattern to prevent the transition of the scanning signal transmitted on the second scanning line GA2 from affecting the potential of the first conductive connection portion 31, thereby ensuring the operation stability and reliability of the sub-pixel driving circuit. At the same time, the electrical connection between the second scanning line GA2 and the gate electrode T4-*g* of the data writing-in transistor is also ensured.

Figure 8:
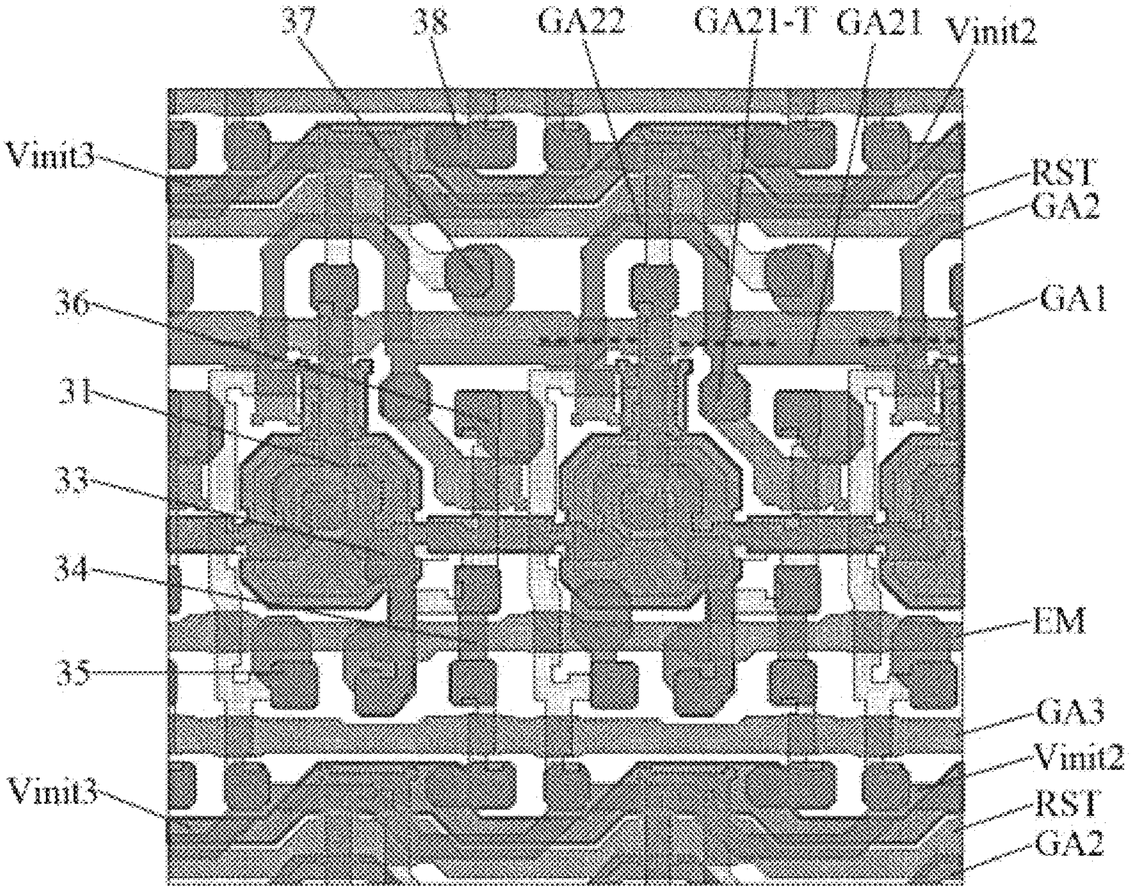
FIG. 8 is a schematic diagram of the layout of a first source-drain metal layer added on the basis of FIG. 6.
Figure 9:
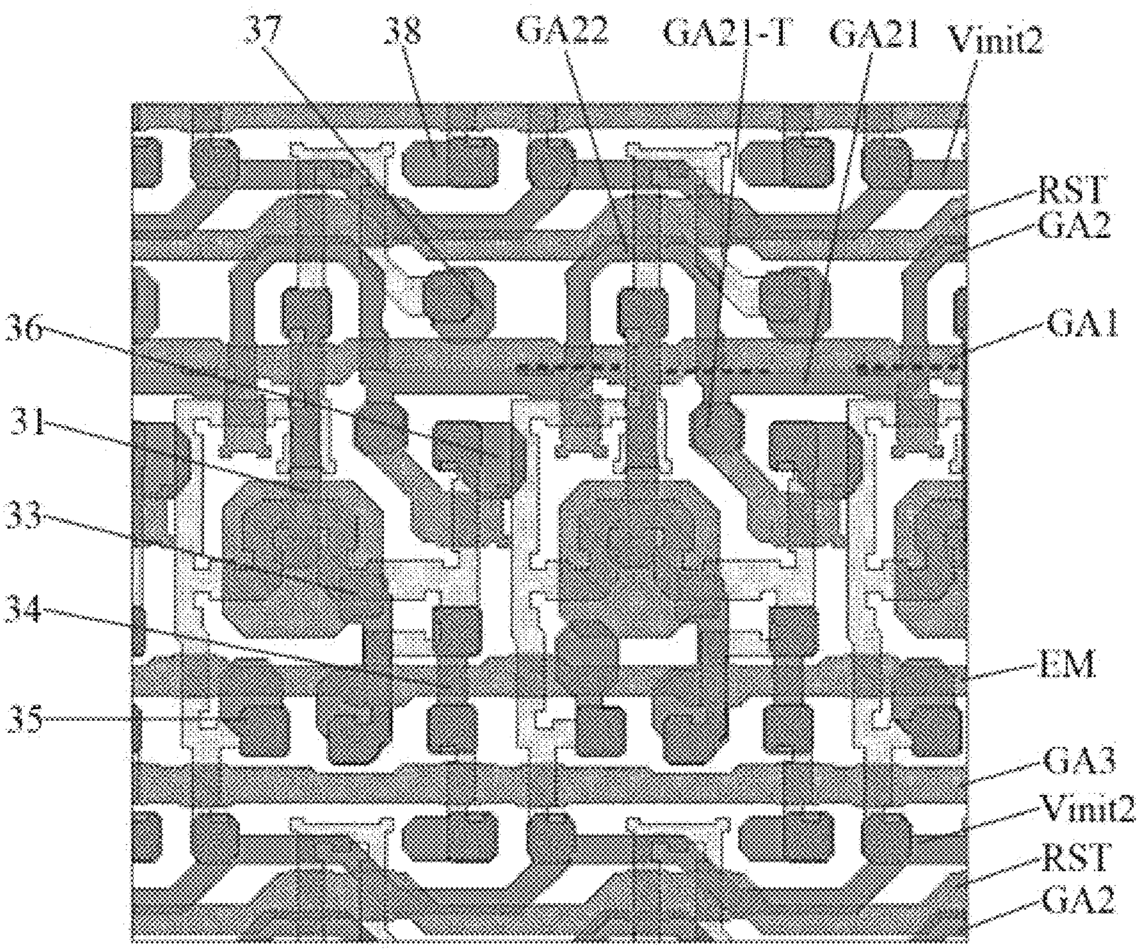
FIG. 9 is a schematic diagram of the layout of a first source-drain metal layer added on the basis of FIG. 4.
Figure 12:
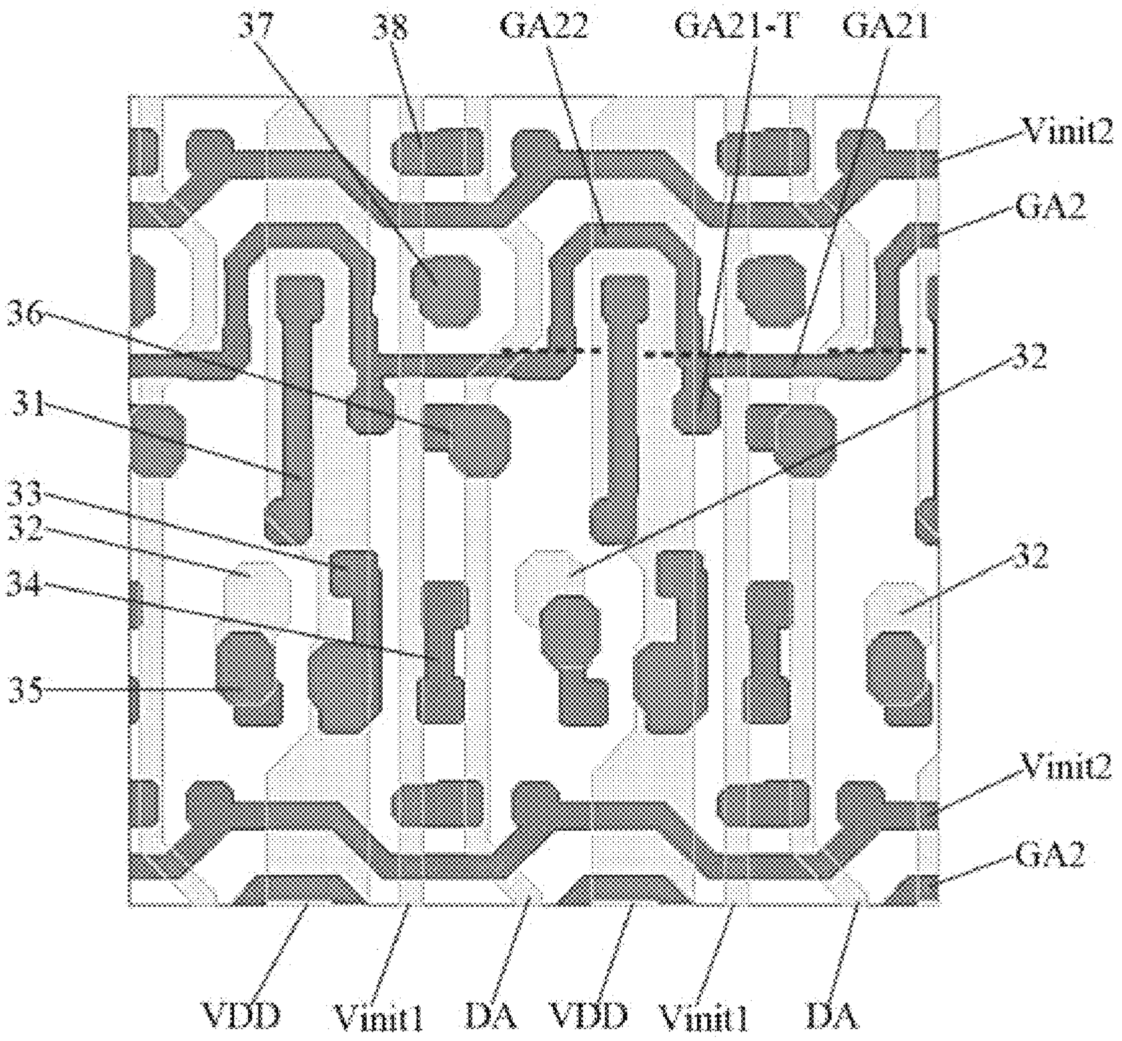
FIG. 12 is a schematic diagram of the layout of the first source-drain metal layer and the second source-drain metal layer according to an embodiment of the present disclosure.

As shown in FIGS. 8 and 12, in some embodiments, the display substrate includes a reset signal line RST, the gate electrode of the first reset transistor is coupled to the corresponding reset signal line RST, and the orthographic projection of the curved edge portion GA22 on the base substrate partially overlaps the orthographic projection of the reset signal line RST on the base substrate; and/or, the orthographic projection of the curved edge portion GA22 on the base substrate partially overlaps the orthographic projection of the first scanning line GA1 on the base substrate.

Exemplarily, the display substrate includes a plurality of reset signal lines RST, the plurality of reset signal lines RST are arranged along the second direction, and the reset signal lines RST include at least a portion extending along the first direction. The plurality of reset signal lines RST correspond to the plurality of rows of sub-pixel driving circuits in a one-to-one manner, and the reset signal lines RST are respectively coupled to sub-pixel driving circuits in a corresponding row of sub-pixel driving circuits.

Exemplarily, the overlapping area between the orthographic projection of the curved edge portion GA22 on the base substrate and the orthographic projection of the reset signal line RST on the base substrate is less than or equal to the 10% of the area of the curved edge portion GA22. Further, the overlapping area between the orthographic projection of the curved edge portion GA22 on the base substrate and the orthographic projection of the reset signal line RST on the base substrate can be set to be less than or equal to 5% of the area of the curved edge portion GA22.

Exemplarily, the overlapping area between the orthographic projection of the curved edge portion GA22 on the base substrate and the orthographic projection of the first scanning line GA1 on the base substrate is less than or equal to 30% of the area of the curved edge portion GA22. Further, the overlapping area between the orthographic projection of the curved edge portion GA22 on the base substrate and the orthographic projection of the first scanning line GA1 on the base substrate can be set to be less than or equal to 20% of the area of the curved edge portion GA22.

The above arrangement can avoid crosstalk between the second scanning line GA2 and the reset signal line RST, and avoid crosstalk between the second scanning line GA2 and the first scanning line GA1 to the greatest extent.

As shown in FIGS. 7, 8, 10, and 11, in some embodiments, the display substrate further includes a power line VDD, and there is a first overlapping area between the orthographic projection of the power line VDD on the base substrate and the orthographic projection of the first conductive connection portion 31 on the base substrate, and the first overlapping area is greater than or equal to 80% of the area of the first conductive connection portion 31.

For example, the first overlapping area is greater than or equal to 90% of the area of the first conductive connection portion 31.

Exemplarily, the display substrate includes a plurality of power lines VDD, the plurality of power lines VDD are arranged along the first direction, and the power lines VDD include at least a portion extending along the second direction. The plurality of power lines VDD correspond to the plurality of columns of sub-pixel driving circuits in a one-to-one manner, and the power lines VDD are respectively coupled to sub-pixel driving circuits in the corresponding column of sub-pixel driving circuits.

For example, the power line VDD and the source-drain metal layer in the display substrate are arranged in the same layer and made of the same material.

The above-mentioned setting of the first overlapping area is greater than or equal to 80% of the area of the first conductive connection portion 31 so that the power line VDD can better shield the potential on the first conductive connection portion 31 (i.e. the potential of the N1 node). Therefore, in the display substrate provided by the above embodiments, through reasonable layout, the potential of the N1 node can be better shielded through the power line VDD, and the risk of crosstalk in the sub-pixel driving circuit during the display process can be reduced.

Figure 10:
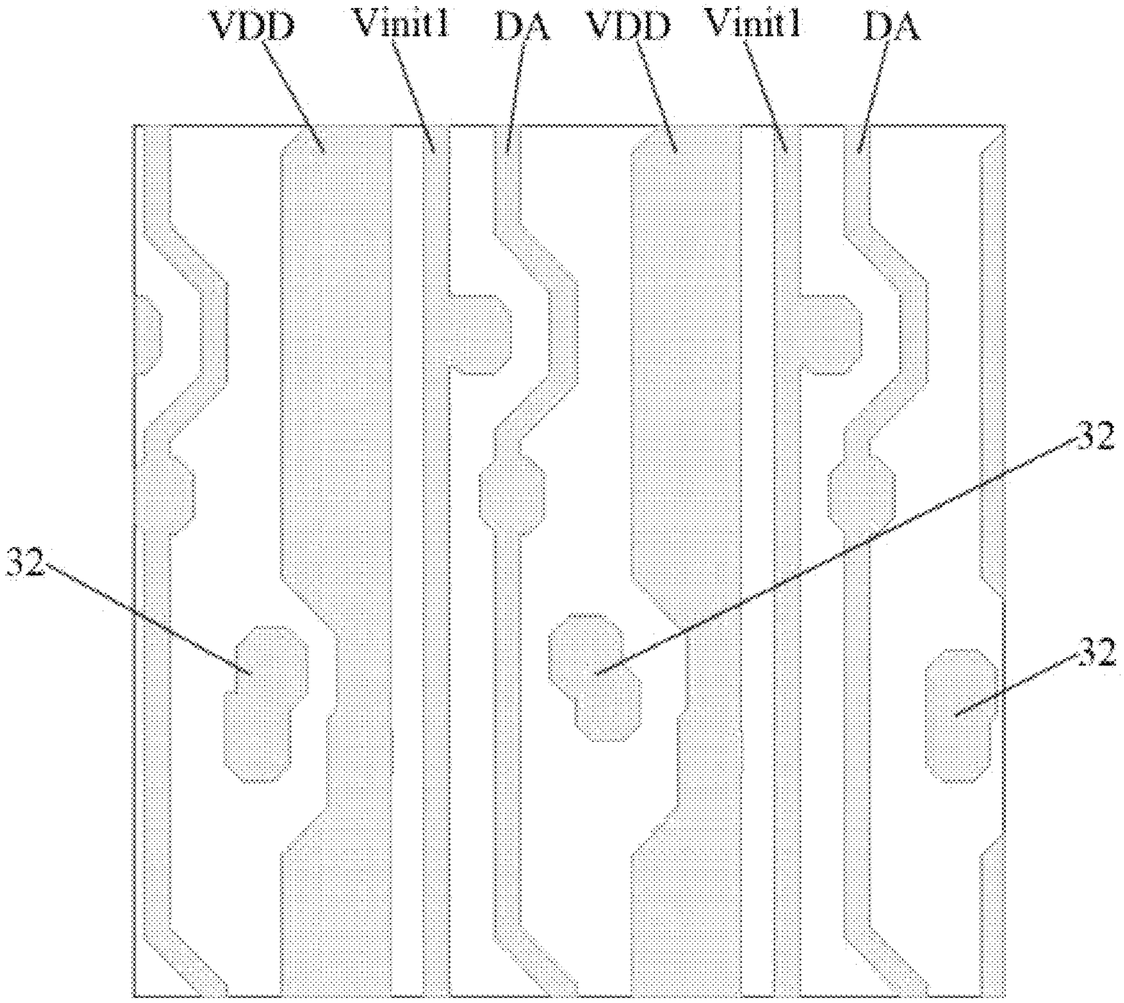
FIG. 10 is a schematic diagram of the layout of the second source-drain metal layer of the display substrate according to an embodiment of the present disclosure.
Figure 11:
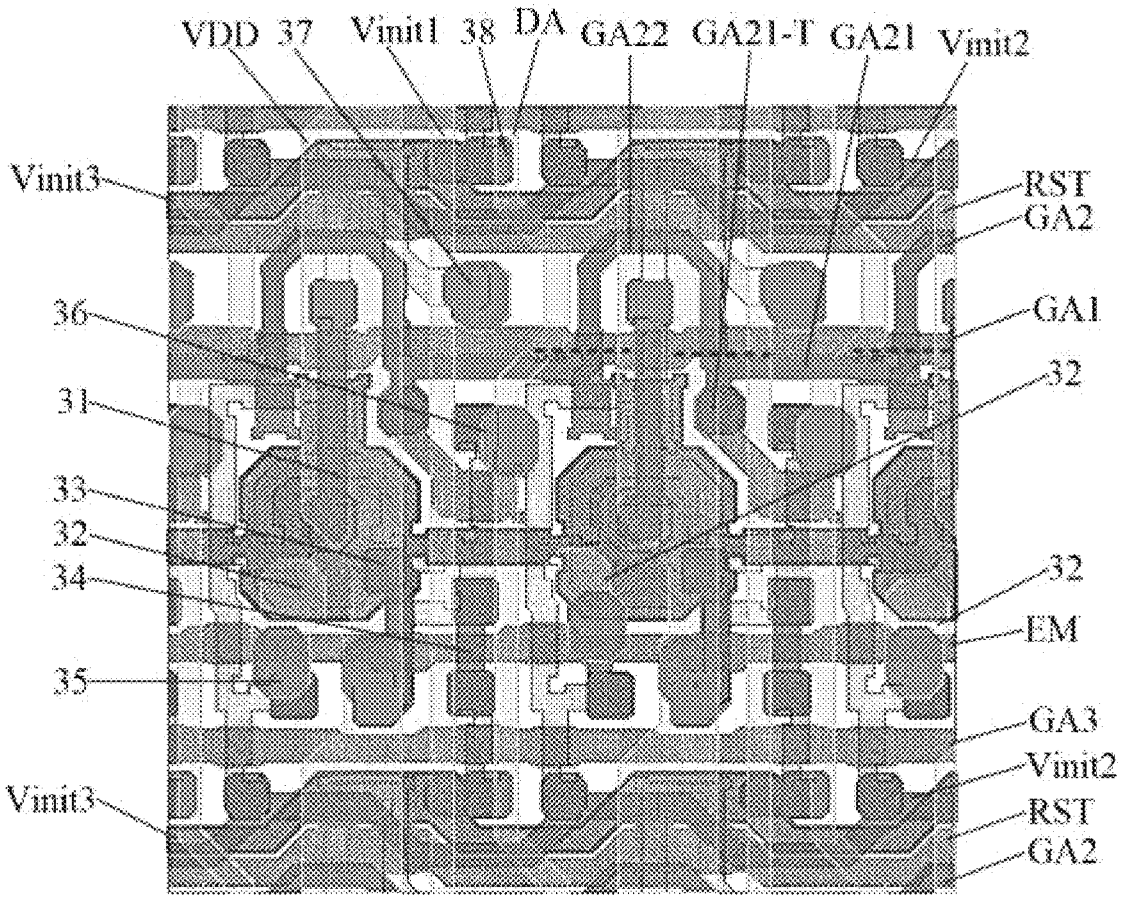
FIG. 11 is a schematic diagram of the layout of a second source-drain metal layer added on the basis of FIG. 8.

As shown in FIGS. 10 to 12, in some embodiments, the display substrate further includes a first initialization signal line Vinit1, the first initialization signal line Vinit1 includes at least a portion extending along the second direction; the first electrode of the first reset transistor is coupled to the first initialization signal line Vinit1.

Exemplarily, the display substrate includes a plurality of first initialization signal lines Vinit1, the plurality of first initialization signal lines Vinit1 are arranged along the first direction, and the first initialization signal line Vinit1 includes at least a portion extending along the second direction. The first initialization signal line Vinit1 corresponds to a plurality of columns of sub-pixel driving circuits in a one-to-one manner, and the first initialization signal line Vinit1 is respectively coupled to each sub-pixel driving circuit in a corresponding column of sub-pixel driving circuits.

Exemplarily, the orthographic projection of the first initialization signal line Vinit1 on the base substrate is located between the orthographic projection of the gate electrode T3-*g* of the driving transistor on the base substrate and the orthographic projection of the data line DA on the base substrate. Laying out the first initialization signal line Vinit1 in the above manner can shield the N1 node from crosstalk caused by the transition of the data signal transmitted on the data line DA through the first initialization signal line Vinit1.

Exemplarily, the display substrate further includes a power line VDD, the first initialization signal line Vinit1, the power line VDD and the data line DA are arranged in the same layer and made of the same material, and the first initialization signal line Vinit1 is located at between the power line VDD and the data line DA. For example, the first initialization signal line Vinit1 and the second source-drain metal layer in the display substrate are arranged in the same layer and made of the same material.

Exemplarily, the overlapping area between the orthographic projection of the power line VDD on the base substrate and the lower metal layer (such as the light shielding layer LS, the first gate metal layer, the second gate metal layer and the first source-drain metal layer) is greater than or equal to 50% of the area of the power line VDD. Further, the overlapping area between the orthographic projection of the power line VDD on the base substrate and the lower metal layer can be set to be greater than or equal to 70% of the area of the power line VDD, but is not limited to this. The above arrangement is beneficial to improving the transmittance of the high-resolution display substrate.

As shown in FIGS. 4 to 11, in some embodiments, the display substrate further includes a second initialization signal line Vinit2, a third initialization signal line Vinit3 and a third scanning line GA3. The third scanning line GA3 includes at least part extending along the first direction; the sub-pixel also includes a light emitting element; the sub-pixel driving circuit also includes a second reset transistor (i.e., the seventh transistor T7) and a third reset transistor (i.e., the eighth transistor T8), the gate electrode of the second reset transistor and the gate electrode of the third reset transistor are both coupled to the corresponding same third scanning line GA3; the first electrode of the second reset transistor is coupled to the second initialization signal line Vinit2, the second electrode of the second reset transistor is coupled with the anode Ano of the light emitting element; the first electrode of the third reset transistor is coupled to the third initialization signal line Vinit3, the second electrode of the third reset transistor is coupled to the first electrode of the driving transistor.

Exemplarily, the display substrate further includes a plurality of second initialization signal lines Vinit2, the plurality of second initialization signal lines Vinit2 are arranged along the second direction, and the second initialization signal line Vinit2 includes at least part extending along the first direction. The plurality of second initialization signal lines Vinit2 correspond to the plurality of rows of sub-pixel driving circuits in a one-to-one manner, and the second initialization signal lines Vinit2 are respectively coupled to each second reset transistor in the corresponding row of sub-pixel driving circuits.

Exemplarily, the display substrate further includes a plurality of third initialization signal lines Vinit3, the plurality of third initialization signal lines Vinit3 are arranged along the second direction, and the third initialization signal line Vinit3 includes at least part extending along the first direction. The plurality of third initialization signal lines Vinit3 correspond to the plurality of rows of sub-pixel driving circuits in a one-to-one manner, and the third initialization signal lines Vinit3 are respectively coupled to each third reset transistor in the corresponding row of sub-pixel driving circuits.

Exemplarily, the display substrate further includes a plurality of third scanning lines GA3, the plurality of third scanning lines GA3 are arranged along the second direction, and the third scanning line GA3 includes at least part extending along the first direction. The plurality of third scanning lines GA3 are coupled to the plurality of rows of sub-pixel driving circuits, and the third scanning lines GA3 are coupled to the gate electrode of each second reset transistor and the gate electrode of each third transistor of the corresponding row of sub-pixel driving circuits.

The second initialization signal transmitted by the second initialization signal line Vinit2 is configured to reset the anode of the light emitting element (i.e., the N4 node), which can ensure the brightness of the sub-pixel during low grayscale display. Arranging the second initialization signal line Vinit2 and the first source-drain metal layer in the display substrate in the same layer and made of the same material improves the conductivity of the second initialization signal line Vinit2, which is beneficial to improving the display uniformity of the display substrate.

In some embodiments, the second scanning line and the first scanning line are arranged in different layers, and the orthographic projection of the second scanning line on the base substrate at least partially overlaps the orthographic projection of the first scanning line on the base substrate.

Exemplarily, the display substrate includes a second gate metal layer and a first source-drain metal layer, the second initialization signal line and the first source-drain metal layer are arranged in the same layer and made of the same material, and the third initialization signal line and the second gate metal layer are arranged in the same layer and made of the same material.

The second initialization signal line and the third initialization signal line are made of metal in different layers, so that the second initialization signal line and the third initialization signal line, both of which are configured to transmit constant voltage signals, can be laminated. The orthographic projection of the second initialization signal line on the base substrate at least partially overlaps the orthographic projection of the third initialization signal line on the base substrate, which is beneficial to improving the transmittance of the display substrate.

As shown in FIGS. 2, 4, 6 and 8, in some embodiments, the display substrate further includes a power line VDD; the first reset transistor includes a first reset active layer 21, and the first reset active layer 21 includes a third channel portion 213, a fourth channel portion 214 and a second conductor portion 215. The second conductor portion 215 is coupled to the third channel portion 213 and the fourth channel portion 214 respectively;

The orthographic projection of the second conductor portion 215 on the base substrate at least partially overlaps the orthographic projection of the second initialization signal line Vinit2 on the base substrate; and/or the orthographic projection of the second conductor portion 215 on the base substrate at least partially overlaps the orthographic projection of the third initialization signal line Vinit3 on the base substrate; and/or the orthographic projection of the second conductor portion 215 on the base substrate at least partially overlaps the orthographic projection of the power line VDD on the base substrate.

Exemplarily, the first reset transistor includes a double-gate electrode transistor, and the orthographic projection of the gate electrode of the first reset transistor on the base substrate covers the orthographic projection of the third channel portion 213 on the base substrate, and covers the orthographic projection of the fourth channel portion 214 on the base substrate. The second conductor portion 215 is formed into an integrated structure with the third channel portion 213 and the fourth channel portion 214. Exemplarily, the second conductor portion 215 forms an n-type structure with the third channel portion 213 and the fourth channel portion 214. The third channel portion 213 and the fourth channel portion 214 are arranged along the first direction.

The above arrangement enables the second conductor portion 215 to be shielded by the second initialization signal line Vinit2 and/or the third initialization signal line Vinit3, which is beneficial to improving the operating stability of the first reset transistor.

Figure 5:
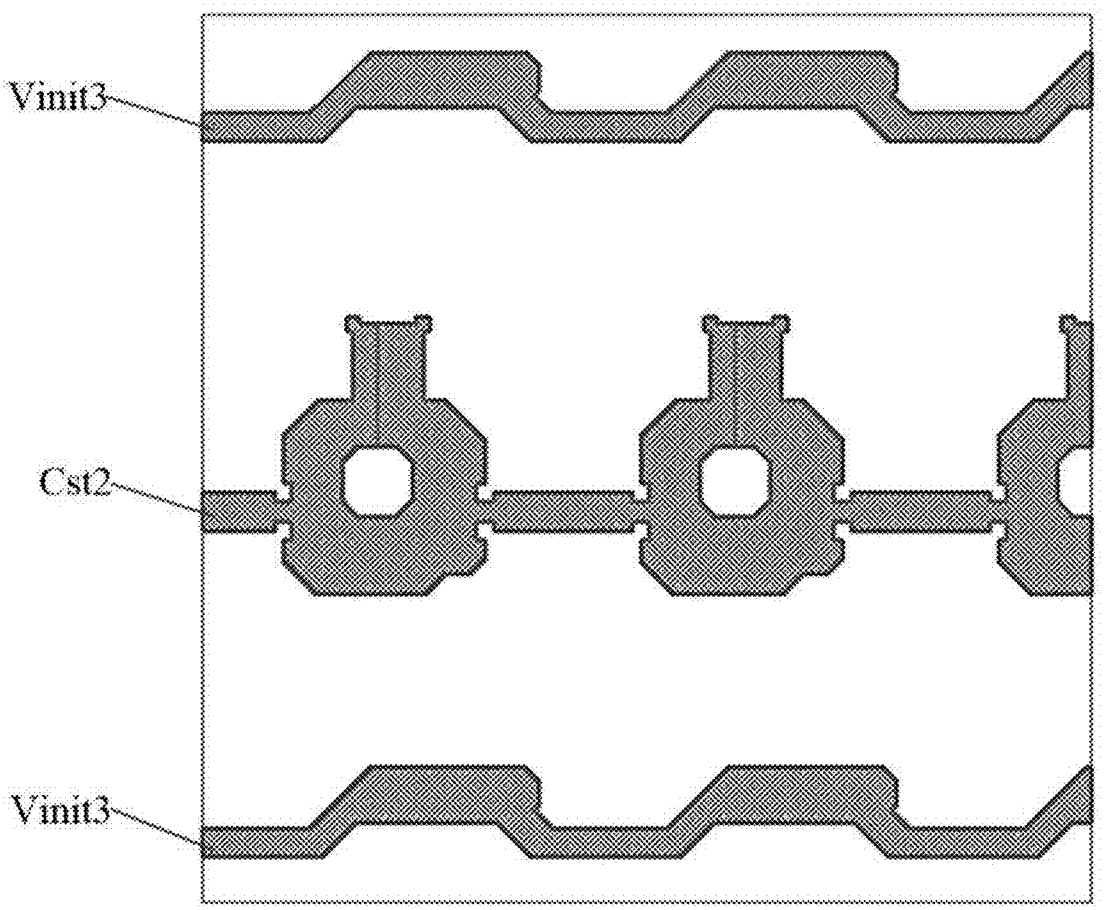
FIG. 5 is a schematic diagram of the layout of the second gate metal layer of the display substrate according to an embodiment of the present disclosure.
Figure 6:
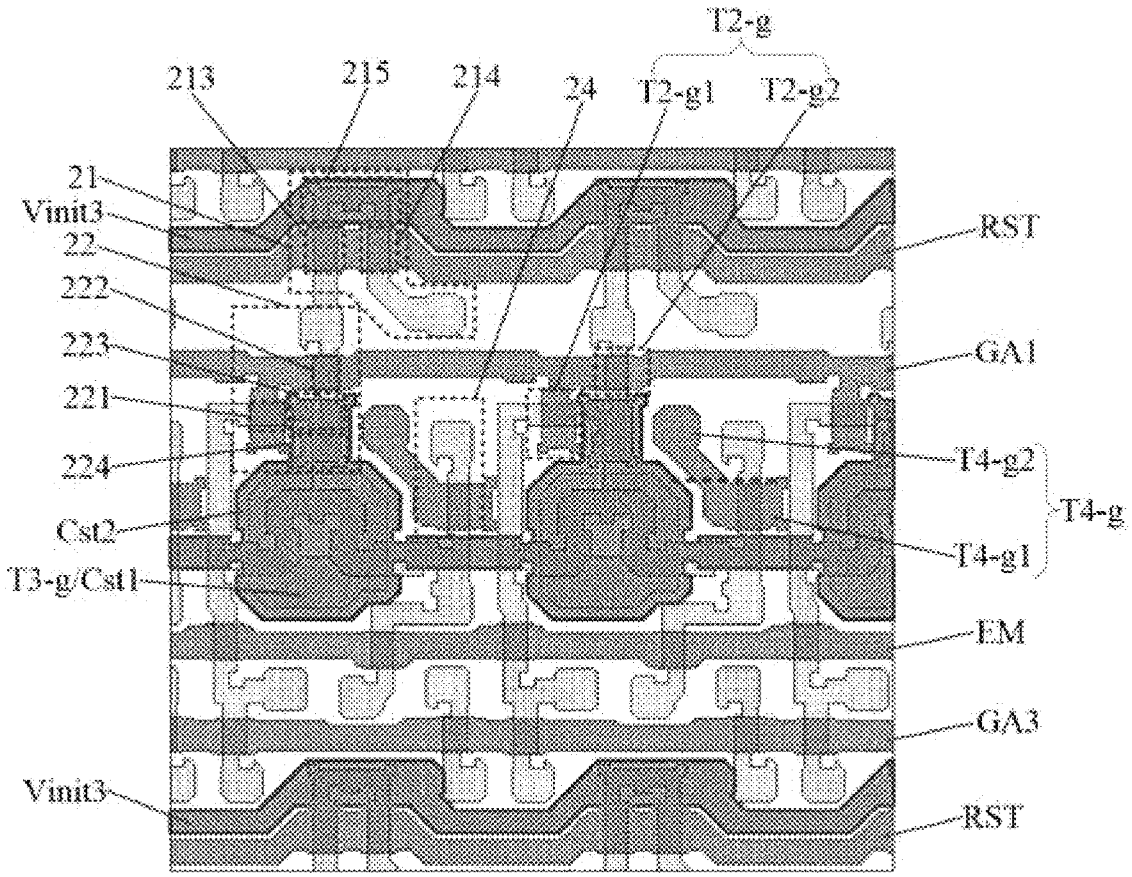
FIG. 6 is a schematic diagram of the layout of a second gate metal layer added on the basis of FIG. 4.
Figure 7:
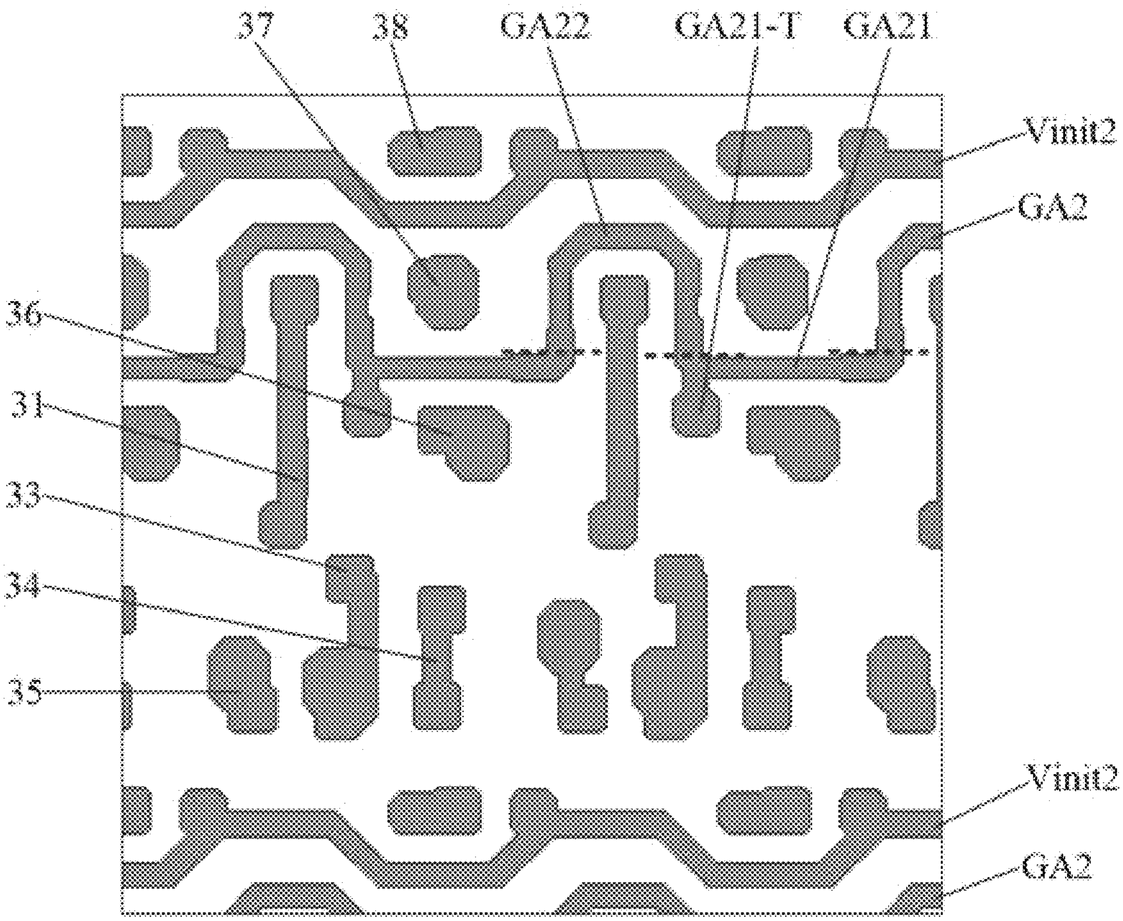
FIG. 7 is a schematic diagram of the first layout of the first source-drain metal layer of the display substrate according to an embodiment of the present disclosure.

As shown in FIGS. 2, 5 and 6, in some embodiments, the display substrate further includes a power line VDD and a first conductive connection portion 31, the first end of the first conductive connection portion 31 is coupled to the gate electrode T3-*g* of the driving transistor, and the second end of the first conductive connection portion 31 is coupled to the second electrode of the compensation transistor; the sub-pixel driving circuit also includes a storage capacitor Cst, and the first electrode plate Cst1 of the storage capacitor Cst is coupled to the gate electrode T3-*g* of the driving transistor, and the second electrode plate Cst2 of the storage capacitor Cst is coupled to the corresponding power line VDD;

The compensation active layer 22 further includes a conductor extension portion 224 coupled to the first conductor portion 223, and the orthographic projection of the conductor extension portion 224 on the base substrate at least partially overlaps the orthographic projection of the second electrode plate Cst2 on the base substrate; and/or, The orthographic projection of the first conductor portion 223 on the base substrate does not overlap the orthographic projection of the first conductive connection portion 31 on the base substrate; and/or, The orthographic projection of the second electrode plate Cst2 on the base substrate at least partially overlaps the orthographic projection of the first conductor portion 223 on the base substrate.

Exemplarily, the orthographic projection of the first electrode plate Cst1 on the base substrate at least partially overlaps the orthographic projection of the second electrode plate Cst2 on the base substrate.

Exemplarily, the conductor extension portion 224 and the first conductor portion 223 are formed into an integrated structure.

Exemplarily, the orthographic projection of the conductor extension portion 224 on the base substrate is located between the orthographic projection of the first conductor portion 223 on the base substrate and the orthographic projection of the gate electrode T3-*g* of the driving transistor on the base substrate.

The above arrangement adds the capacitor formed by the first conductor portion 223. This arrangement is conducive to improving the capacitor formed by the first conductor portion 223 during the light emitting phase, and at the same time adds the stability of the node voltage of the first conductor portion 223, which can effectively improve low-frequency flicker problems.

Figure 1:
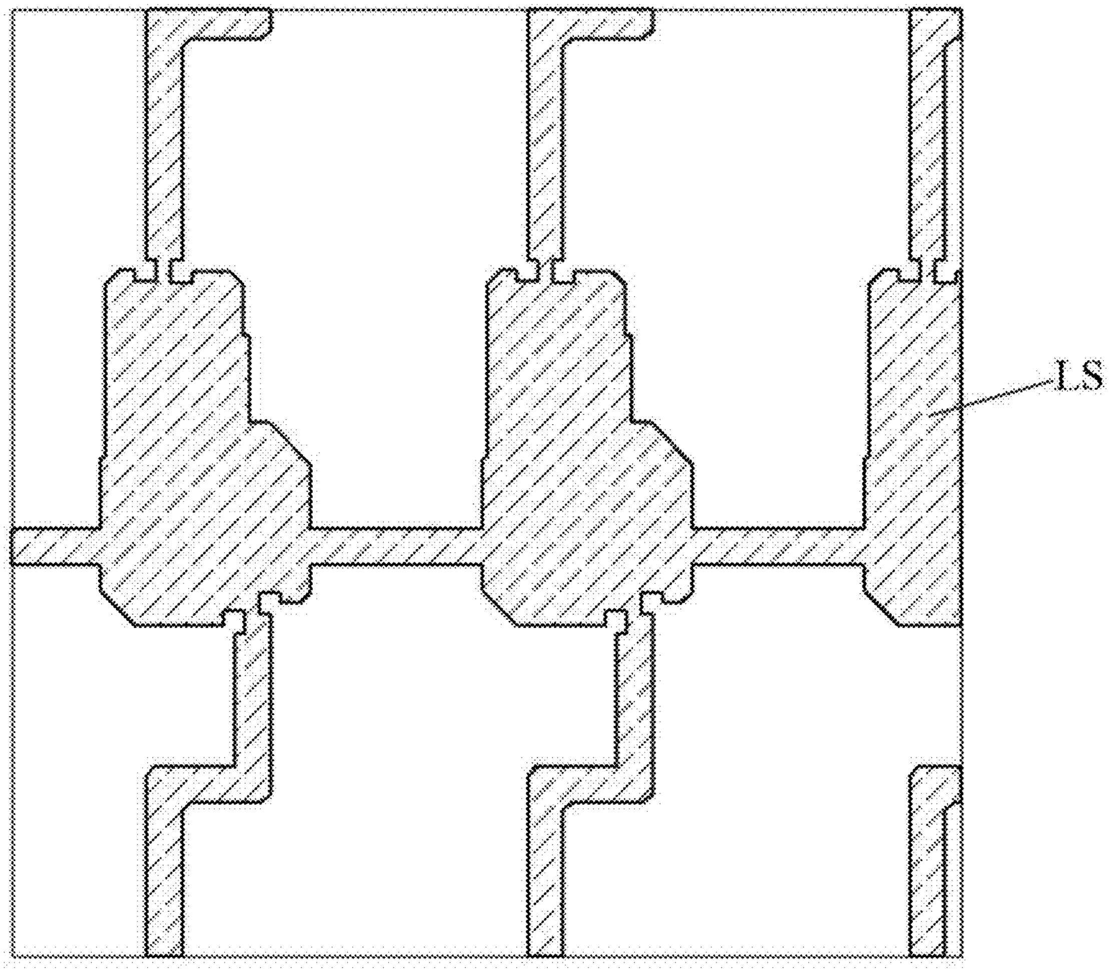
FIG. 1 is a schematic diagram of the layout of the light shielding layer of a display substrate according to an embodiment of the present disclosure.
Figure 13:
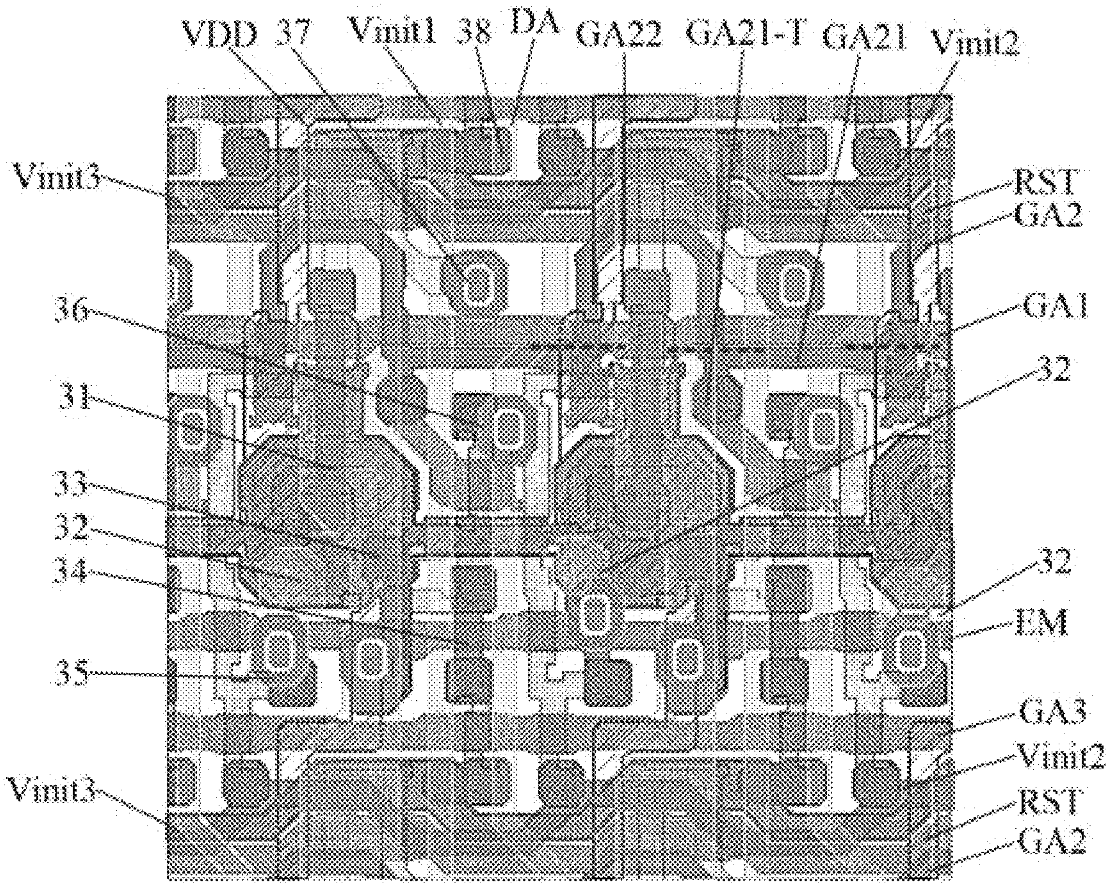
FIG. 13 is a schematic diagram of the light shielding layer and via holes in the second planarization layer added on the basis of FIG. 11.
Figure 14:
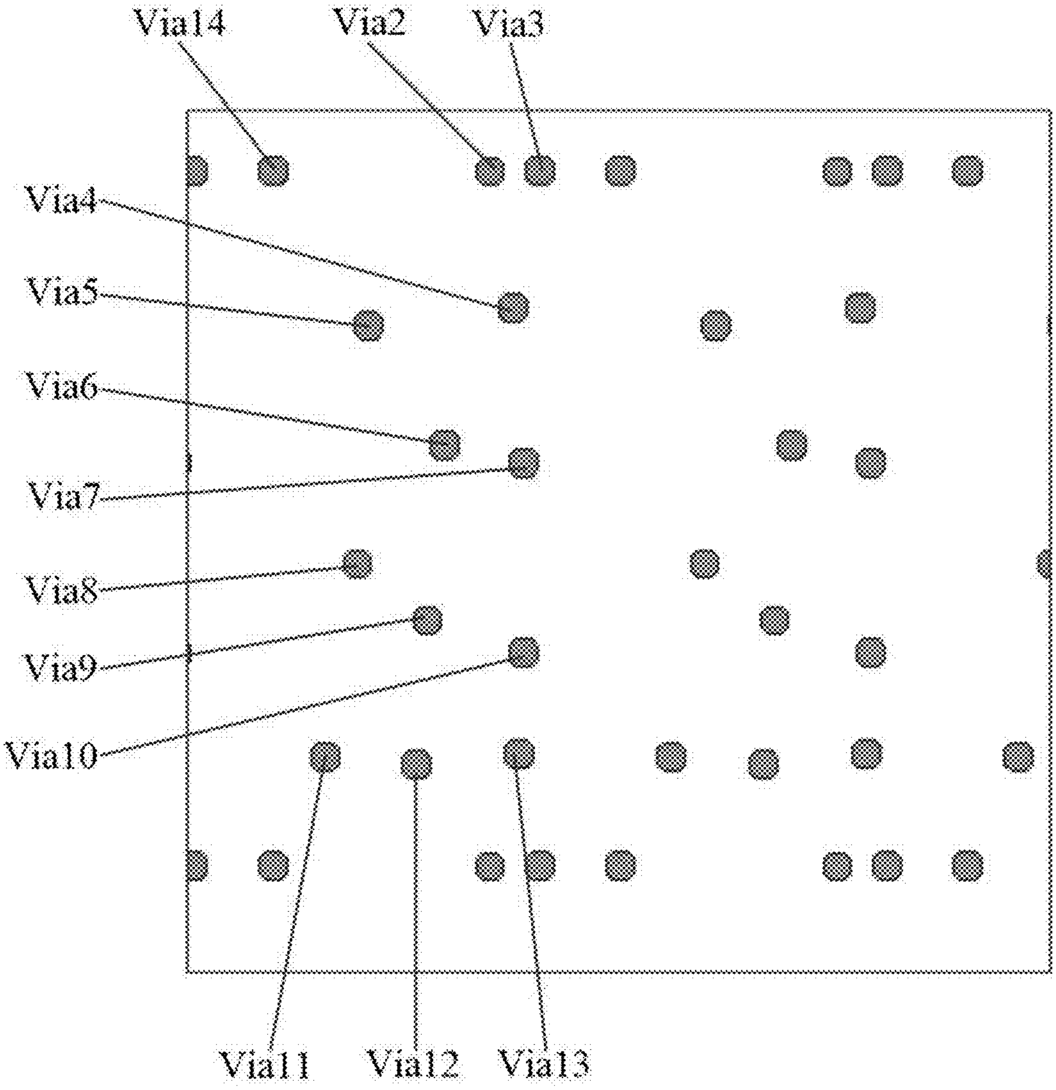
FIG. 14 is a schematic diagram of a via hole formed on an interlayer insulating layer according to an embodiment of the present disclosure.
Figure 15:
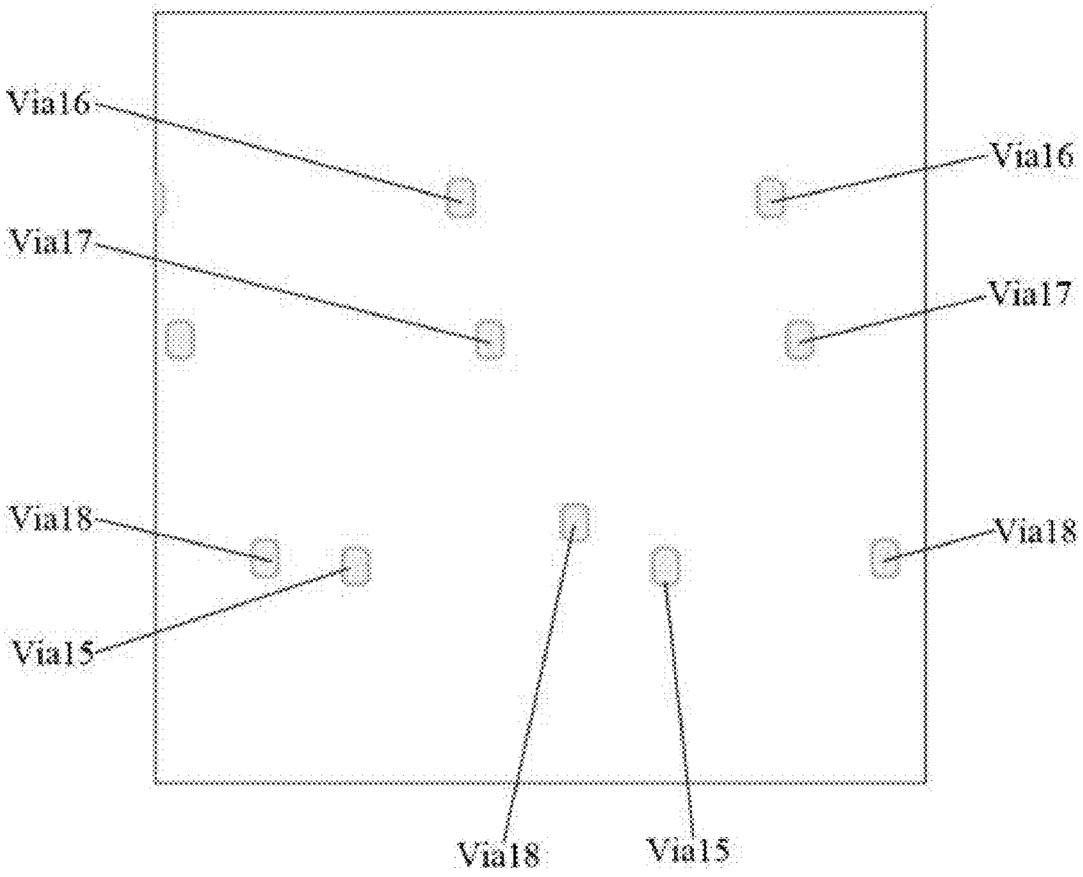
FIG. 15 is a schematic diagram of a via hole formed on the first planarization layer according to an embodiment of the present disclosure.
Figure 16:
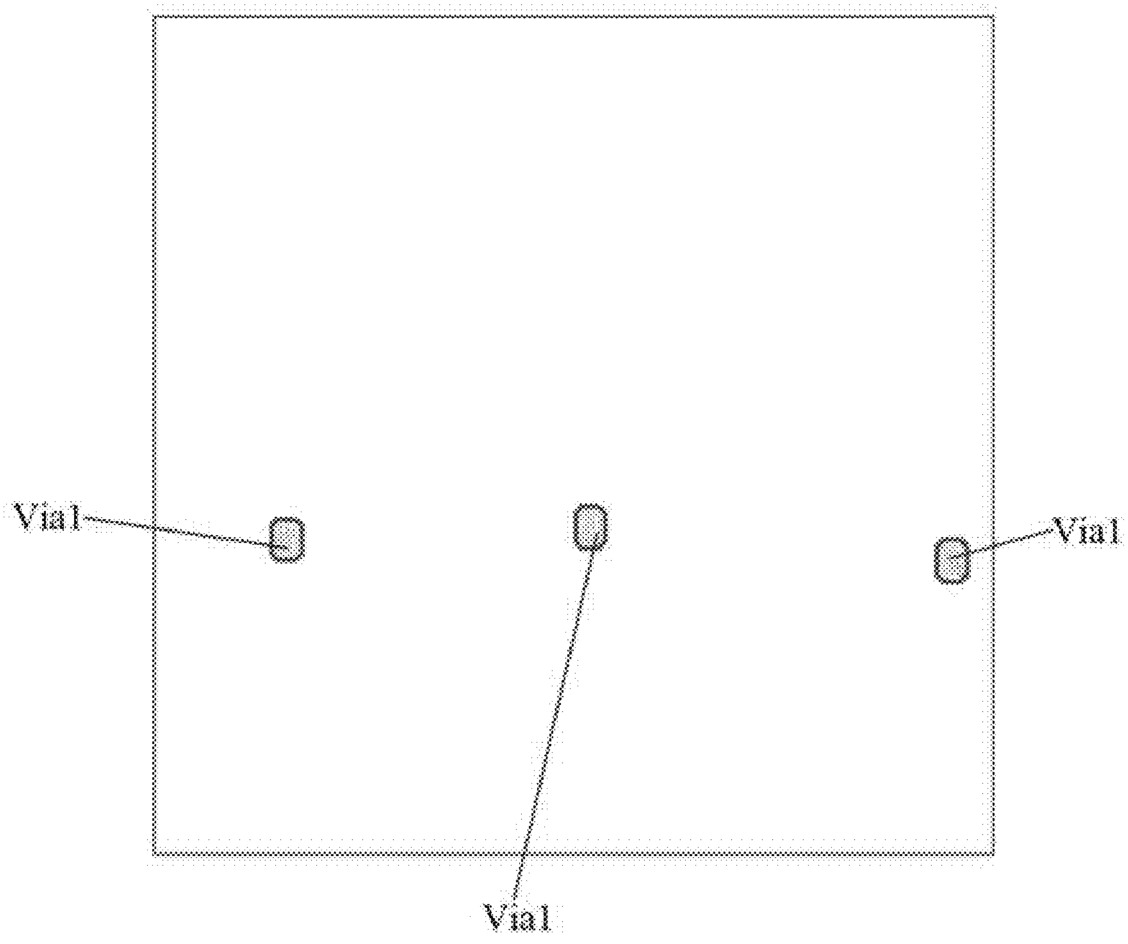
FIG. 16 is a schematic diagram of a via hole formed on the second planarization layer according to an embodiment of the present disclosure.
Figure 17:
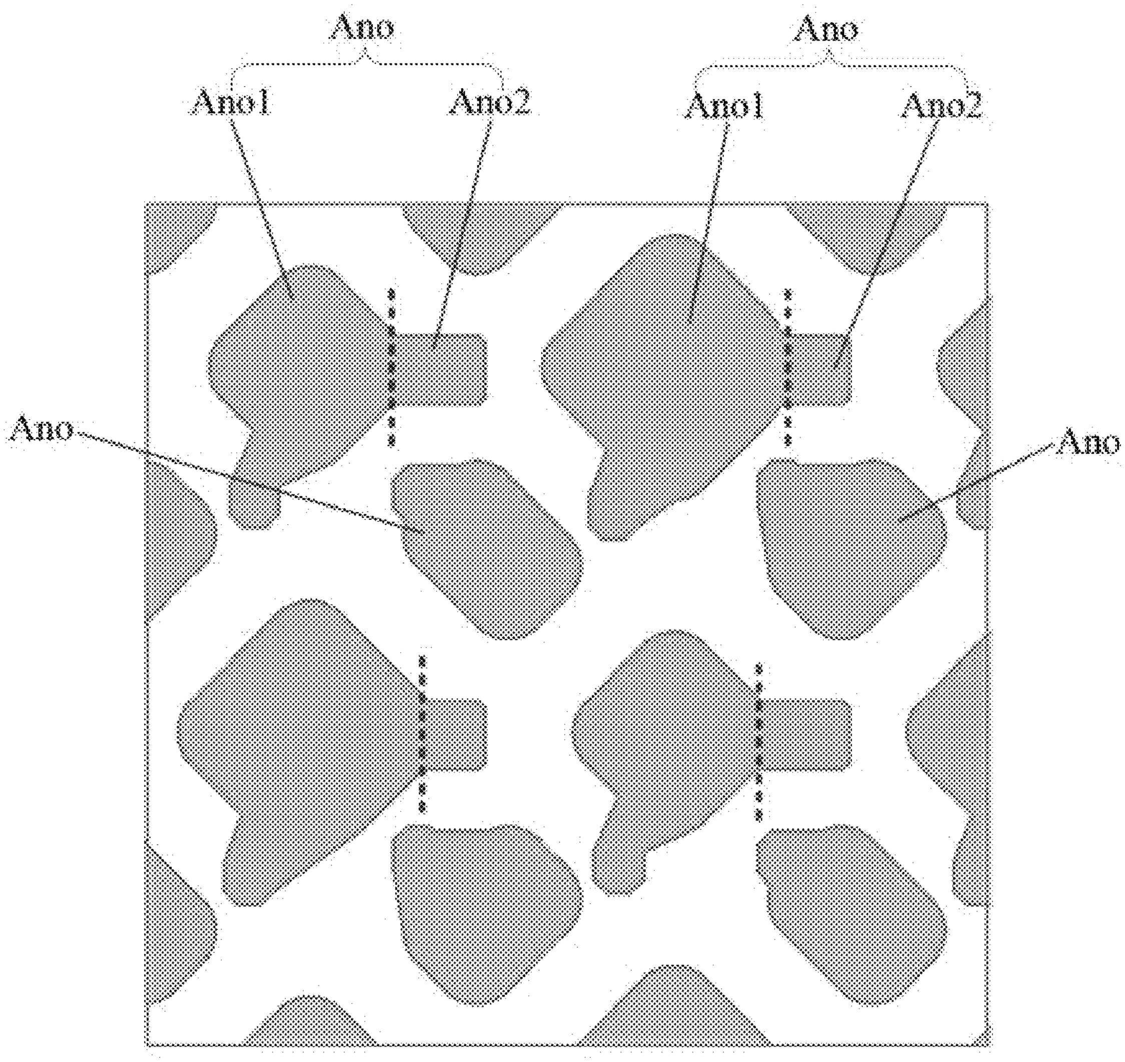
FIG. 17 is a schematic diagram of the layout of an anode layer according to an embodiment of the present disclosure.
Figure 18:
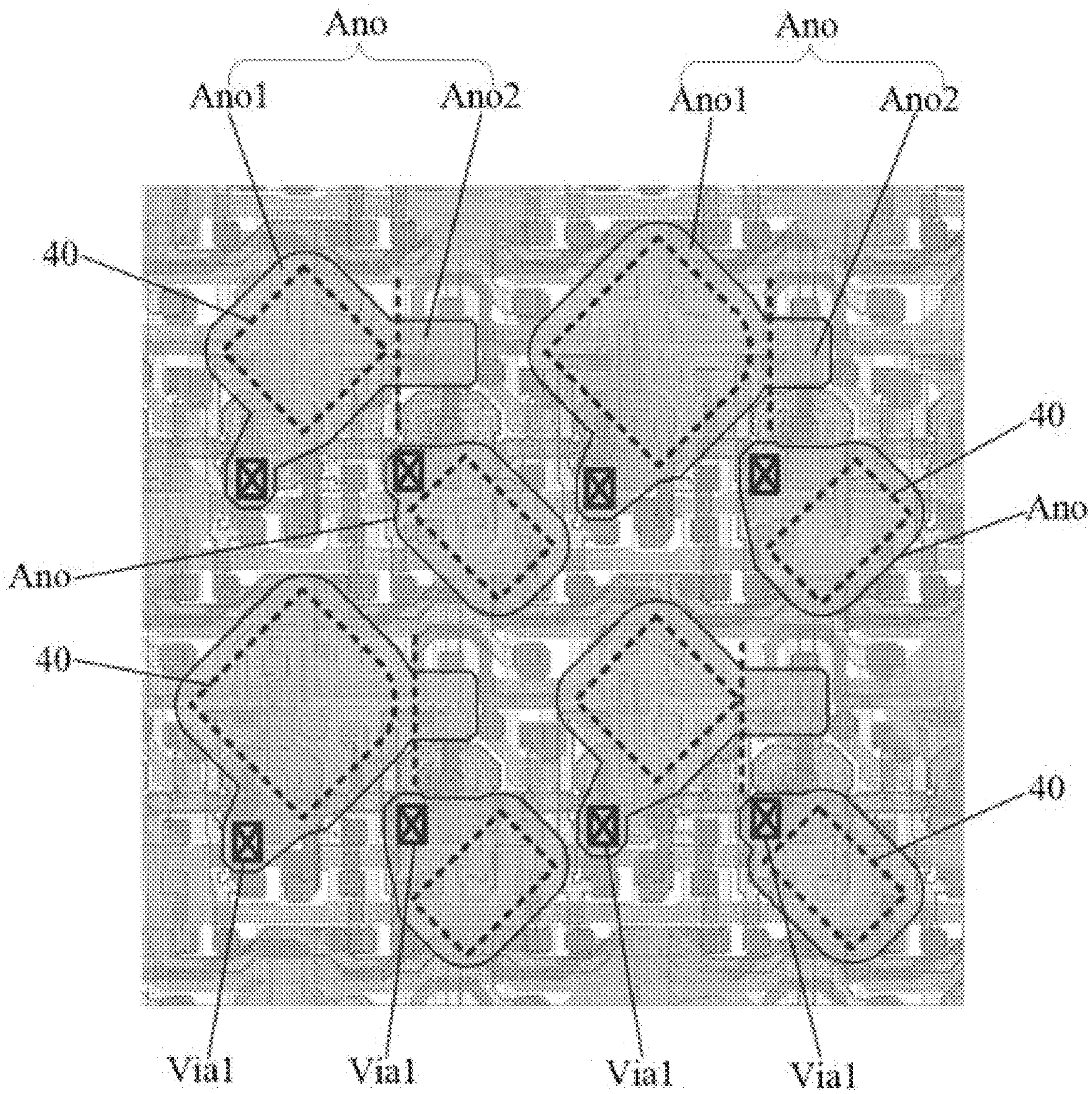
FIG. 18 is a schematic diagram of the layout of an anode layer added on the basis of FIG. 13.

As shown in FIGS. 1, 2 and 13, in some embodiments, the display substrate further includes a light-shielding layer LS, and the orthographic projection of the light-shielding layer LS on the base substrate at least partially overlaps the orthographic projection of the active layer 23 of the driving transistor on the base substrate, at least partially overlaps the orthographic projection of the compensation active layer 22 on the base substrate.

Exemplarily, the light-shielding layer LS is connected to a power signal. The light shielding layer LS is located between the active layer and the base substrate.

The above arrangement enables the light-shielding layer LS to block and shield the active layer 23 of the driving transistor and the compensation active layer 22, thereby conducive to improving the working stability of the driving transistor and the compensation transistor.

Exemplarily, the overlapping area between the orthographic projection of the light-shielding layer LS on the base substrate and the orthographic projection of the metal layer in the display substrate on the base substrate is greater than or equal to the 60% of the area of the light shielding layer LS. Further, the overlapping area between the orthographic projection of the light shielding layer LS on the base substrate and the orthographic projection of the metal layer in the display substrate on the base substrate can be set to be greater than or equal to the 80% of the area of the light shielding layer LS. This arrangement is beneficial to improving the optical transmittance of the display substrate.

As shown in FIG. 4, in some embodiments, the sub-pixel driving circuit further includes a power control transistor (i.e., the fifth transistor T5) and a light emitting control transistor (i.e., the sixth transistor T6). The display substrate further includes a plurality of light emitting control signal lines EM, the plurality of light emitting control signal lines EM are arranged along the second direction, and the light emitting control signal lines EM include at least a portion extending along the first direction. The plurality of light emitting control signal lines EM correspond to the plurality of rows of sub-pixel driving circuits in a one-to-one manner. The light emitting control signal lines EM are respectively coupled to each power control transistor and each light emitting control transistor in the corresponding row of sub-pixel driving circuits.

As shown in FIGS. 12, 13, 16, 17 and 18, in some embodiments, the sub-pixel further includes a light emitting element, and the light emitting element includes an anode Ano; the sub-pixel driving circuit also includes a light emitting control transistor and the second conductive connection portion 32, the first electrode of the light emitting control transistor is coupled to the second electrode of the driving transistor, the first end of the second conductive connection portion 32 is connected to the second electrode of the light emitting control transistor, and the second end of the second conductive connection portion 32 is coupled to the anode Ano through the first via hole Via1;

The sub-pixel further includes a pixel opening area 40, and the orthographic projection of the pixel opening area 40 on the base substrate does not overlap the orthographic projection of the first via Via1 on the base substrate.

Exemplarily, the display substrate includes a pixel defining layer that defines the pixel opening area 40.

The above arrangement that the orthographic projection of the pixel opening area 40 on the base substrate does not overlap the orthographic projection of the first via Via1 on the base substrate is beneficial to improving the flatness of the anode Ano in the sub-pixel, thereby improving the display uniformity of the display substrate.

As shown in FIGS. 2, 4, 17 and 18, in some embodiments, the sub-pixels further include a light emitting element, and the light emitting element includes an anode Ano; the anode Ano of at least part of the sub-pixels includes an anode body portion Ano1 and the anode dummy portion Ano2; the orthographic projection of the anode body portion Ano1 on the base substrate at least partially overlaps the orthographic projection of the compensation active layer 22 included in the sub-pixel to which the anode body portion Ano1 belong on the base substrate; the orthographic projection of the anode dummy portion Ano2 on the base substrate at least partially overlaps the orthographic projection of the compensation active layer 22 included in the sub-pixel adjacent thereto along the first direction on the base substrate.

Exemplarily, the anode body portion Ano1 and the anode dummy portion Ano2 are formed into an integrated structure.

Exemplarily, the orthographic projection of the anode body portion Ano1 on the base substrate at least partially overlaps the orthographic projection of the first conductor portion 223 in the compensation active layer 22 included in the sub-pixel to which the anode body portion Ano1 belongs on the base substrate. The orthographic projection of the anode body portion Ano1 on the base substrate at least partially overlaps the orthographic projection of the first channel portion 221 in the compensation active layer 22 included in the sub-pixel to which the anode body portion Ano1 belongs on the base substrate. The orthographic projection of the anode body portion Ano1 on the base substrate at least partially overlaps the orthographic projection of the second channel portion 222 in the compensation active layer 22 included in the sub-pixel to which the anode body portion Ano1 belongs on the base substrate.

Exemplarily, in the orthographic projection of the anode dummy portion Ano2 on the base substrate at least partially overlaps the orthographic projection of the first conductor portion 223 in the compensation active layer 22 included in the sub-pixel adjacent to it along the first direction on the base substrate. The orthographic projection of the anode dummy portion Ano2 on the base substrate at least partially overlaps the orthographic projection of the first channel portion 221 in the compensation active layer 22 included in the sub-pixels adjacent to it along the first direction on the base substrate. The orthographic projection of the anode dummy portion Ano2 on the base substrate at least partially overlaps the orthographic projection of the second channel portion 222 in the compensation active layer 22 included in the sub-pixels adjacent to it along the first direction on the base substrate.

In the display substrate provided by the above embodiment, the corresponding compensation active layer 22 is blocked by the anode body portion Ano1 and the anode dummy portion Ano2, which can effectively prevent the display substrate from displaying abnormally under strong light.

In some embodiments, the display substrate includes red sub-pixels, green sub-pixels and blue sub-pixels; at least part of the sub-pixels include red sub-pixels and blue sub-pixels, and the adjacent sub-pixels include green sub-pixels.

Exemplarily, the orthographic projection of the anode body portion Ano1 in the red sub-pixel on the base substrate at least partially overlaps the orthographic projection of the compensation active layer 22 included in the sub-pixel to which it belongs on the base substrate; the orthographic projection of the anode dummy portion Ano2 in the red sub-pixel on the base substrate at least partially overlaps the orthographic projection of the compensation active layer 22 included in the green sub-pixel adjacent to it along the first direction on the base substrate.

Exemplarily, the orthographic projection of the anode body portion Ano1 in the blue sub-pixel on the base substrate at least partially overlaps the orthographic projection of the compensation active layer 22 included in the sub-pixel to which it belongs on the base substrate; the orthographic projection of the anode dummy portion Ano2 in the blue sub-pixel on the base substrate at least partially overlaps the orthographic projection of the compensation active layer 22 included in the green sub-pixel adjacent to it along the first direction on the base substrate.

Figure 21:
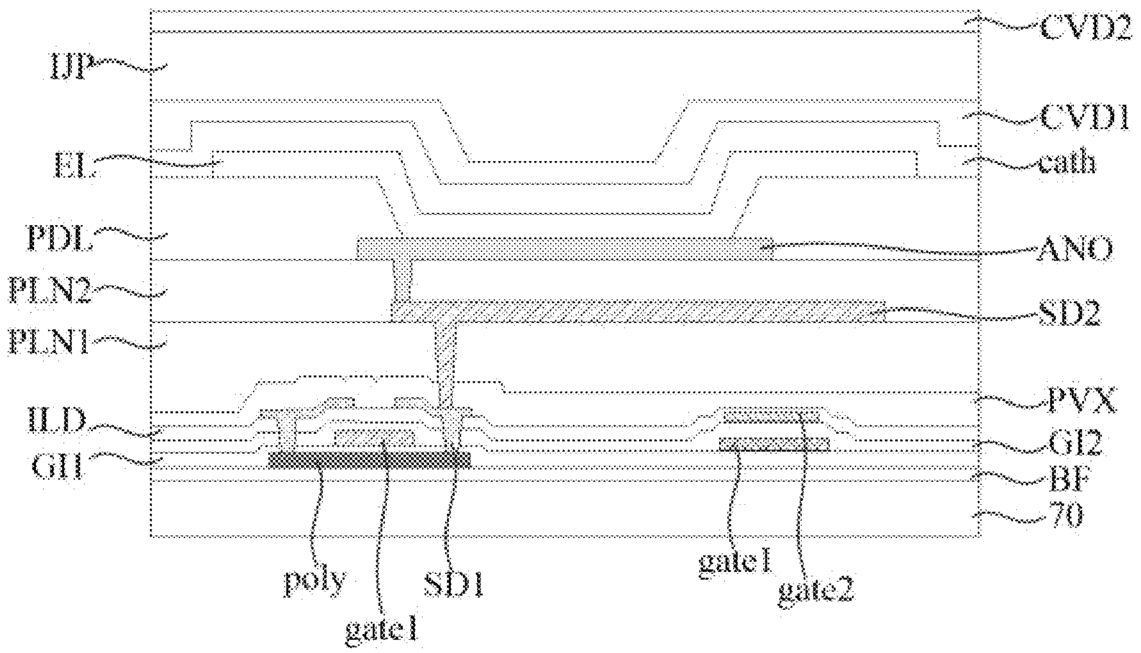
FIG. 21 is a schematic cross-sectional view of each film layer of the display substrate according to an embodiment of the present disclosure.

As shown in FIG. 21, for example, the display substrate includes a buffer layer BF, an active layer poly, a first gate insulating layer GI1, and a first gate metal layer gate1, a second gate insulating layer GI2, a second gate metal layer gate2, an interlayer insulating layer ILD, a first source-drain metal layer SD1, a first planarization layer PLN1, a second source-drain metal layer SD2, a second planarization layer PLN2, an anode layer ANO, a light emitting functional layer EL, a cathode layer cath, a first inorganic encapsulation layer CVD1, an organic encapsulation layer IJP and a second inorganic encapsulation layer CVD2, etc. laminated sequentially in a direction away from the base substrate 70. The display substrate may also include a passivation layer PVX, but is not limited thereto.

As shown in FIG. 2, the active layer 25 of the power control transistor, the active layer 26 of the light emitting control transistor, the active layer 27 of the second reset transistor and the active layer 28 of the third reset transistor are illustrated in FIG. 2.

As shown in FIGS. 7, 14 to 16, FIG. 7 illustrates the third conductive connection portion 33, the fourth conductive connection portion 34, the fifth conductive connection portion 35, the sixth conductive connection portion 36, and the seventh conductive connection portion 37 and the eighth conductive connection portion 38.

The third conductive connection portion 33 is coupled to the second electrode plate Cst2 of the storage capacitor Cst through the ninth via hole Via9, and the third conductive connection portion 33 is coupled to the second electrode of the power control transistor through the twelfth via hole Via12. The third conductive connection portion 33 is coupled to the power line VDD through the fifteenth via hole Via15.

The fourth conductive connection portion 34 is coupled to the first electrode of the driving transistor through the tenth via hole Via10, and the fourth conductive connection portion 34 is coupled to the second electrode of the third reset transistor through the thirteenth via hole Via13.

The fifth conductive connection portion 35 is coupled to the second electrode of the light emitting control transistor through the eleventh via hole Via11, and the fifth conductive connection portion 35 is coupled to the second conductive connection portion 32 through the eighteenth via hole Via18. The second conductive connection portion 32 is coupled to the anode through the first via hole Via1.

The sixth conductive connection portion 36 is coupled to the first electrode of the data writing-in transistor through the seventh via hole Via7, and the sixth conductive connection portion 36 is coupled to the data line DA through the seventeenth via hole Via17.

The seventh conductive connection portion 37 is coupled to the first electrode of the first reset transistor through the fourth via hole Via4, and the seventh conductive connection portion 37 is coupled to the first initialization signal line Vinit1 through the sixteenth via hole Via16.

The eighth conductive connection portion 38 is coupled to the third initialization signal line Vinit3 through the second via hole Via2, and the eighth conductive connection portion 38 is coupled to the first electrode of the eighth transistor T8 through the third via hole Via3.

The first conductive connection portion 31 is coupled to the second electrode of the first reset transistor through the fifth via hole Via5, and the first conductive connection portion 31 is coupled to the gate electrode T3-*g* of the driving transistor through the eighth via hole Via8.

The gate electrode T4-*g* of the data writing-in transistor is coupled to the second scanning line GA2 through the sixth via hole Via6.

The first electrode of the second reset transistor is coupled to the second initialization signal line Vinit2 through the fourteenth via hole Via14.

An embodiment of the present disclosure also provides a display substrate, including: a base substrate and a plurality of sub-pixels, a second scanning line, and a data line all arranged on the base substrate; the second scanning line includes at least part extending along a first direction, the sub-pixel includes a sub-pixel driving circuit, the sub-pixel driving circuit includes a first conductive connection portion, a driving transistor, a compensation transistor and a data writing-in transistor;

A first electrode of the compensation transistor is coupled to a second electrode of the driving transistor, and a second electrode of the compensation transistor is coupled to a gate electrode of the driving transistor through the first conductive connection portion; the compensation transistor includes a compensation active layer the compensation active layer includes a first channel portion, a second channel portion, and a first conductor portion, the first conductor portion is coupled to the first channel portion, the second channel portion and the first conductor portion, respectively; at least part of an orthographic projection of the first conductor portion on the base substrate is located between an orthographic projection of the second scanning line on the base substrate and the orthographic projections of the gate electrode of the driving transistor on the base substrate;

A gate electrode of the data writing-in transistor is coupled to the corresponding second scanning line, a first electrode of the data writing-in transistor is coupled to the corresponding data line, and a second electrode of the data writing-in transistor is coupled to the first electrode of the driving transistor; at least part of the second scanning line is arranged around one end of the first conductive connection portion.

According to the specific structure of the above display substrate, in the display substrate provided by the embodiment of the present disclosure, at least part of the orthographic projection of the first conductor portion on the base substrate is located between the orthographic projection of the second scanning line on the base substrate and the orthographic projection of the gate electrode of the driving transistor on the base substrate; compared with the conventional layout, the above arrangement makes the compensation transistor form a double-gate inverted structure, that is, in the same sub-pixel driving circuit layout area, both the first conductor portion and the first compensation gate can be arranged in the area between the second scanning line and the gate electrode of the drive transistor, which effectively compresses the vertical design space occupied by the sub-pixel driving circuit and is conducive to the development of high-resolution display substrates.

In the display substrate provided by the embodiment of the present disclosure, at least part of the second scanning line is arranged around one end of the first conductive connection portion, so that the second scanning line can bypass the first conductive connection portion, which not only avoids a short circuit between the second scanning line and the first conductive connection portion, but also enables the second scanning line to maintain an appropriate safe distance from the first conductive connection portion, thereby preventing the transition of the scanning signal transmitted on the first conductive connection portion from affecting the potential of the first conductive connection portion, ensuring the working stability and reliability of the sub-pixel driving circuit.

In some embodiments, the display substrate further includes a power line; the sub-pixel driving circuit further includes a storage capacitor, the first electrode plate of the storage capacitor is coupled to the gate electrode of the driving transistor, and the second electrode plate of the storage capacitor is coupled to the corresponding power line; the orthographic projection of the second electrode plate on the base substrate at least partially overlaps the orthographic projection of the first conductor portion on the base substrate; and/or, An orthographic projection of the first conductor portion on the base substrate at least partially overlaps an orthographic projection of the first conductive connection portion on the base substrate.

The above arrangement is conducive to improving the capacitor formed by the first conductor portion during the light emitting phase, and at the same time, it can increase the stability of the node voltage of the first conductor portion and the voltage stability of the first conductive connection portion, which can effectively improve low frequency flicker problem.

In some embodiments, the display substrate further includes a power line; the sub-pixel driving circuit further includes a storage capacitor, the first electrode plate of the storage capacitor is coupled to the gate electrode of the driving transistor, and the second electrode plate of the storage capacitor is coupled to the corresponding power line; the orthographic projection of the second electrode plate on the base substrate at least partially overlaps the orthographic projection of the first conductor portion on the base substrate; and/or, The orthographic projection of the first conductor portion on the base substrate does not overlap the orthographic projection of the first conductive connection portion on the base substrate; and/or, The orthographic projection of the first conductor portion on the base substrate at least partially overlaps the orthographic projection of the power line on the base substrate; and/or, An orthographic projection of the first conductive connection portion on the base substrate at least partially overlaps an orthographic projection of the power line on the base substrate.

Figure 22:
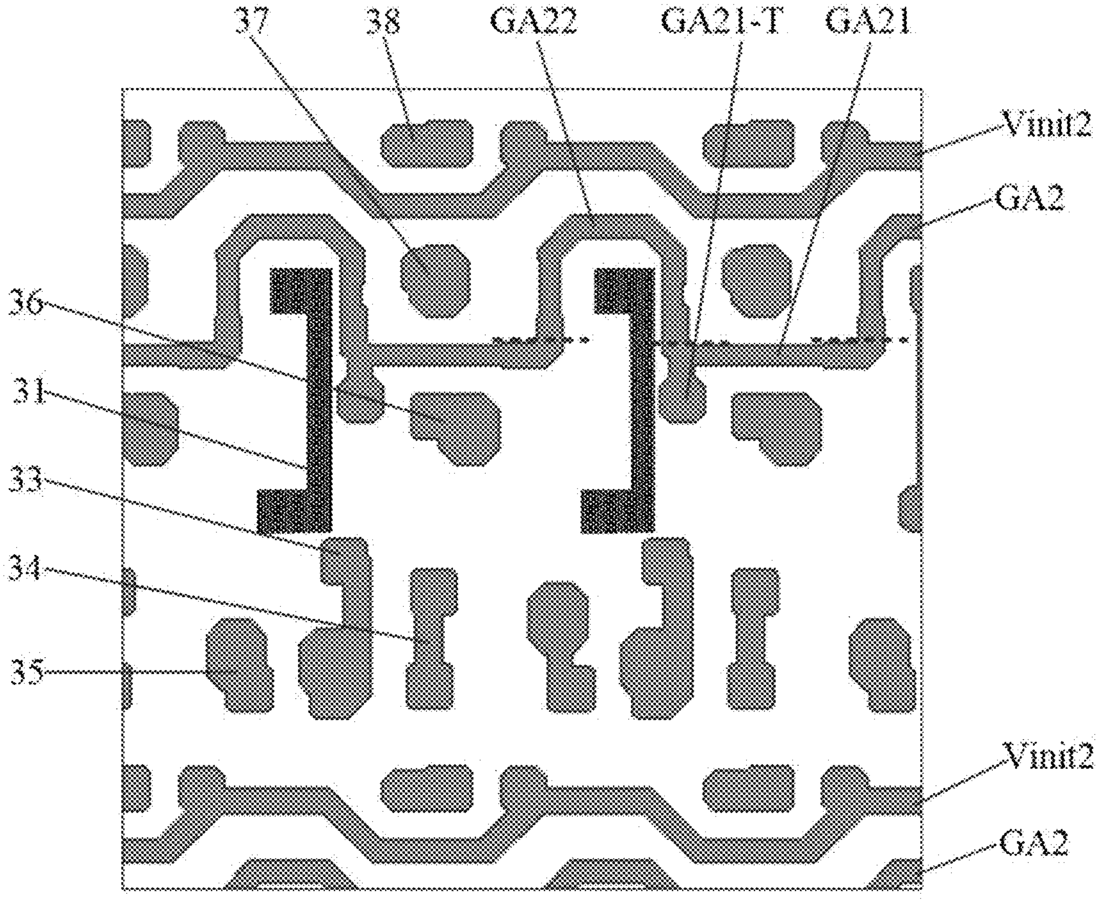
FIG. 22 is a schematic diagram of a second layout of the first source-drain metal layer in the display substrate according to an embodiment of the present disclosure.

It is worth noting that the specific structure of the first conductive connection portion 31 in the above embodiment can be seen in FIG. 22, but it is not limited to this structure.

The above arrangement is conducive to improving the capacitor formed by the first conductor portion during the light emitting phase, and at the same time, it can increase the stability of the node voltage of the first conductor portion and the voltage stability of the first conductive connection portion, which can effectively improve the low frequency flicker problem.

An embodiment of the present disclosure also provides a display device, including the display substrate provided in the above embodiment.

In the display substrate provided by the above embodiment, the compensation transistor includes a compensation active layer, and at least part of the orthographic projection of the first conductor portion in the compensation active layer on the base substrate is located between the orthographic projection of the first scanning line on the base substrate and the orthographic projection of the gate electrode of the driving transistor on the base substrate. Compared with the conventional layout method, the above arrangement method enables the compensation transistor to form a double-gate inverted structure, that is, in the same sub-pixel driving circuit layout area, the first conductor portion and the first compensation gate can be both arranged in an area between the first scanning line and the gate electrode of the driving transistor, which effectively compresses the vertical design space occupied by the sub-pixel driving circuit, which is conducive to the development of high resolution of the display substrate. Furthermore, since the gate electrode of the compensation transistor is coupled to the first scanning line, the first electrode of the compensation transistor is coupled to the second electrode of the driving transistor, and the second electrode of the compensation transistor is coupled to the gate electrode of the drive transistor, that is, the compensation transistor itself is coupled to the first scanning line and the driving transistor. Therefore, at least part of the compensation active layer is arranged in an area between the first scanning line and the gate electrode of the driving transistor, which will not cause defects due to differences in potential therebetween. Therefore, the display substrate provided by the above embodiments comprehensively considers the working principles, working conditions, possible defects, etc. of the sub-pixel driving circuit and signal lines, and arranges the design reasonably to improve the resolution and avoid defects.

When the display device provided by the embodiment of the present disclosure includes the above-mentioned display substrate, it also has the above-mentioned beneficial effects, which will not be described again here.

It should be noted that the signal line extending along the X direction means that the signal line includes a body portion and a secondary portion connected to the body portion. The body portion is a line, line segment or bar-shaped body, and the body portion extends along the X direction, and the length of the body portion extending along the X direction is greater than the length of the secondary portion extending along the other directions.

It should be noted that the display device can be any product or component with a display function such as a television, a monitor, a digital photo frame, a mobile phone, a tablet computer, etc. The display device also includes a flexible circuit board, a printed circuit board and a back panel etc.

It should be noted that the layout area occupied by the sub-pixel driving circuit may be an area capable of accommodating the sub-pixel driving circuit. For example, the area may be a rectangular area, but is not limited to this.

It should be noted that the "same layer" in the embodiments of the present disclosure may refer to film layers on the same structural layer. Or for example, the film layers on the same layer may be a layer structure formed by using the same film formation process to form a film layer for forming a specific pattern, and then using the same mask to pattern the film layer through a patterning process. Depending on the specific pattern, a patterning process may include multiple exposure, development or etching processes, and the specific pattern in the formed layer structure may be continuous or discontinuous. These specific graphics may also be at different heights or have different thicknesses.

In the various method embodiments of the present disclosure, the serial numbers of each step cannot be configured to limit the order of each step. For those of ordinary skill in the art, the sequence of each step can be changed without creative work, which is also within the protection scope of the present disclosure.

It should be noted that each embodiment is described in a progressive manner, and the same and similar parts between the various embodiments can be referred to each other. Each embodiment focuses on its differences from other embodiments. In particular, the method embodiments are described simply because they are basically similar to the product embodiments. Relevant details refer to the description of the product embodiments.

Unless otherwise defined, technical terms or scientific terms used in this disclosure shall have the usual meaning understood by a person skilled in the art to which this disclosure belongs. "First", "second" and similar words used in the present disclosure do not indicate any order, quantity or importance, but are only configured to distinguish different components. Words such as "include" or "comprise" mean that the elements or things appearing before the word include the elements or things listed after the word and their equivalents, without excluding other elements or things. Words such as "connected," "coupled," are not limited to physical or mechanical connections, but may include electrical connections, whether direct or indirect. “Up”, “down”, “left”, “right”, etc. are only configured to express relative positional relationships. When the absolute position of the described object changes, the relative positional relationship may also change accordingly.

It will be understood that when an element such as a layer, film, area or substrate is referred to as being “on” or “under” another element, it can be “directly on” or “under” the other element, or intermediate elements may be present.

In the above description of the embodiments, specific features, structures, materials or characteristics may be combined in any suitable manner in any one or more embodiments or examples.

The above descriptions are implementations of the present disclosure. It should be pointed out that those skilled in the art can make some improvements and modifications without departing from the principle of the present disclosure. These improvements and modifications shall also fall within the scope of the present disclosure.

What is claimed is:

1. A display substrate, comprising: a base substrate, a plurality of sub-pixels and a first scanning line both arranged on the base substrate, wherein the first scanning line includes at least part extending along a first direction, and the subpixel includes a subpixel driving circuit including a driving transistor and a compensation transistor, a gate electrode of the compensation transistor is coupled to a corresponding first scanning line, a first electrode of the compensation transistor is coupled to a second electrode of the driving transistor, a second electrode of the compensation transistor is coupled to a gate electrode of the driving transistor;

the compensation transistor includes a compensation active layer, the compensation active layer includes a first channel portion, a second channel portion and a first conductor portion, the first conductor portion is respectively coupled to the first channel portion and the second channel portion; at least part of an orthographic projection of the first conductor portion on the base substrate is located between an orthographic projection of the first scanning line on the base substrate and the orthographic projection of the gate electrode of the driving transistor on the base substrate.

2. The display substrate according to claim 1, wherein the compensation transistor includes a first compensation gate electrode and a second compensation gate electrode, an orthographic projection of the first compensation gate electrode on the base substrate covers the orthographic projection of the first channel portion on the base substrate, an orthographic projection of the second compensation gate electrode on the base substrate covers the orthographic projection of the second channel portion on the base substrate;

the first compensation gate electrode is coupled to the corresponding first scanning line, and at least part of the first compensation gate electrode is located between the first scanning line to which the first compensation gate electrode is coupled and the gate electrode of the driving transistors, the first scanning line is multiplexed as the second compensation gate electrode.

3. The display substrate according to claim 1, wherein the display substrate further includes a data line and a second scanning line, the second scanning line includes at least part extending along the first direction, the sub-pixel driving circuit further includes a data writing-in transistor, a gate electrode of the data writing-in transistor is coupled to a corresponding second scanning line, a first electrode of the data writing-in transistor is coupled to a corresponding data line, and a second electrode of the data writing-in transistor is coupled to the first electrode of the driving transistor;

in a same sub-pixel, the gate electrode of the data writing-in transistor is located on a side of the first scanning line facing the gate electrode of the driving transistor.

4. The display substrate according to claim 3, wherein the data writing-in transistor includes a data active layer, and the gate electrode of the data writing-in transistor includes a gate body portion and a gate extension portion coupled to each other, an orthographic projection of the gate body portion on the base substrate at least partially overlaps an orthographic projection of the data active layer on the base substrate, the gate extension portion is coupled to the corresponding second scanning line;

the gate body portion and the gate electrode of the driving transistor are arranged along the first direction, and at least part of the gate extension portion and the gate electrode of the driving transistor are arranged along a second direction, and the first direction intersects the second direction; the gate body portion and the gate extension portion are arranged in a same layer or in different layers.

5. The display substrate according to claim 3, wherein the sub-pixel driving circuit further includes a first conductive connection portion and a first reset transistor, and a first end of the conductive connection portion is coupled to the gate electrode of the driving transistor, and a second end of the first conductive connection portion is coupled to the second electrode of the first reset transistor; the second scanning line is at least partially arranged around the second end of the first conductive connection portion.

6. The display substrate according to claim 5, wherein the gate electrode of the data writing-in transistor and the first scanning line are arranged in a same layer and made of a same material, and the second scanning line and the first scanning line are arranged in different layers, the second scanning line and the first conductive connection portion are arranged in a same layer and made of a same material.

7. The display substrate according to claim 5, wherein the second scanning line includes a plurality of straight edge portions and a plurality of curved edge portions, the straight edge portion and the curved edge portion are arranged alternately along the first direction, the curved edge portion is arranged around the second end of the first conductive connection portion, the straight edge portion includes a protruding end, at least part of an orthographic projection of the protruding end on the base substrate and the orthographic projection of the gate electrode of the driving transistor on the base substrate are arranged along the second direction, and the protruding end is coupled to the gate electrode of the data writing-in transistor.

8. The display substrate according to claim 5, wherein the display substrate further includes a first initialization signal line, the first initialization signal line includes at least part extending along the second direction; the first electrode of the first reset transistor is coupled to the first initialization signal line;

the orthographic projection of the first initialization signal line on the base substrate is located between the orthographic projection of the gate electrode of the driving transistor on the base substrate and the orthographic projection of the data line on the base substrate.

9. The display substrate according to claim 8, wherein the display substrate further includes a power line, the first initialization signal line, the power line and the data line are arranged in a same layer and made of a same material, and the first initialization signal line is located between the power line and the data line.

10. The display substrate according to claim 5, wherein the display substrate further includes a second initialization signal line, a third initialization signal line and a third scanning line, the third scanning line includes at least part extending along the first direction; the sub-pixel also includes a light emitting element; the sub-pixel driving circuit also includes a second reset transistor and a third reset transistor, a gate electrode of the second reset transistor and a gate electrode of the third reset transistor are both coupled to a corresponding same third scanning line; a first electrode of the second reset transistor is coupled to the second initialization signal line, a second electrode of the second reset transistor is coupled with an anode of the light emitting element; a first electrode of the third reset transistor is coupled to the third initialization signal line, a second electrode of the third reset transistor is coupled to the first electrode of the driving transistor.

11. The display substrate according to claim 10, wherein the second scanning line and the first scanning line are arranged in different layers, and the orthographic projection of the second scanning line on the base substrate at least partially overlaps the orthographic projection of the first scanning line on the base substrate;

the display substrate includes a second gate metal layer and a first source-drain metal layer, the second initialization signal line and the first source-drain metal layer are arranged in a same layer and made of a same material, and the third initialization signal line and the second gate metal layer are arranged in a same layer and made of a same material.

12. The display substrate according to claim 10, wherein the display substrate further includes a power line; the first reset transistor includes a first reset active layer, and the first reset active layer includes a third channel portion, a fourth channel portion and a second conductor portion, the second conductor portion is coupled to the third channel portion and the fourth channel portion respectively;

an orthographic projection of the second conductor portion on the base substrate at least partially overlaps an orthographic projection of the second initialization signal line on the base substrate; and/or the orthographic projection of the second conductor portion on the base substrate at least partially overlaps an orthographic projection of the third initialization signal line on the base substrate; and/or the orthographic projection of the second conductor portion on the base substrate at least partially overlaps an orthographic projection of the power line on the base substrate.

13. The display substrate according to claim 1, wherein the display substrate further includes a power line and a first conductive connection portion, a first end of the first conductive connection portion is coupled to the gate electrode of the driving transistor, and a second end of the first conductive connection portion is coupled to the second electrode of the compensation transistor; the sub-pixel driving circuit also includes a storage capacitor, and a first electrode plate of the storage capacitor is coupled to the gate electrode of the driving transistor, and a second electrode plate of the storage capacitor is coupled to the corresponding power line;

the compensation active layer further includes a conductor extension portion coupled to the first conductor portion, and an orthographic projection of the conductor extension portion on the base substrate at least partially overlaps an orthographic projection of the second electrode plate on the base substrate; and/or, an orthographic projection of the first conductor portion on the base substrate does not overlap an orthographic projection of the first conductive connection portion on the base substrate; and/or, the orthographic projection of the second electrode plate on the base substrate at least partially overlaps the orthographic projection of the first conductor portion on the base substrate.

14. The display substrate according to claim 1, wherein the display substrate further includes a light-shielding layer, and an orthographic projection of the light-shielding layer on the base substrate at least partially overlaps the orthographic projection of the active layer of the driving transistor on the base substrate, at least partially overlaps the orthographic projection of the compensation active layer on the base substrate.

15. The display substrate according to claim 1, wherein the sub-pixel further includes a light emitting element, and the light emitting element includes an anode; the sub-pixel driving circuit also includes a light emitting control transistor and the second conductive connection portion, a first electrode of the light emitting control transistor is coupled to the second electrode of the driving transistor, a first end of the second conductive connection portion is connected to a second electrode of the light emitting control transistor, and a second end of the second conductive connection portion is coupled to the anode through a first via hole;

the sub-pixel further includes a pixel opening area, and an orthographic projection of the pixel opening area on the base substrate does not overlap an orthographic projection of the first via on the base substrate.

16. The display substrate according to claim 1, wherein the sub-pixels further include a light emitting element, and the light emitting element includes an anode; the anode of at least part of the sub-pixels includes an anode body portion and an anode dummy portion; an orthographic projection of the anode body portion on the base substrate at least partially overlaps an orthographic projection of the compensation active layer included in the sub-pixel to which the anode body portion belong on the base substrate; an orthographic projection of the anode dummy portion on the base substrate at least partially overlaps the orthographic projection of the compensation active layer included in the sub-pixel adjacent to the anode dummy portion along the first direction on the base substrate;

wherein the display substrate includes red sub-pixels, green sub-pixels and blue sub-pixels; at least part of the sub-pixels include red sub-pixels and blue sub-pixels, and adjacent sub-pixels include green sub-pixels.

17. A display device, comprising the display substrate according to claim 1.

18. A display substrate, comprising: a base substrate and a plurality of sub-pixels, a second scanning line, and a data line all arranged on the base substrate; wherein the second scanning line includes at least part extending along a first direction, the sub-pixel includes a sub-pixel driving circuit, the sub-pixel driving circuit includes a first conductive connection portion, a driving transistor, a compensation transistor and a data writing-in transistor;

a first electrode of the compensation transistor is coupled to a second electrode of the driving transistor, and a second electrode of the compensation transistor is coupled to a gate electrode of the driving transistor through the first conductive connection portion; the compensation transistor includes a compensation active layer, the compensation active layer includes a first channel portion, a second channel portion, and a first conductor portion, the first conductor portion is coupled to the first channel portion and the second channel portion, respectively; at least part of an orthographic projection of the first conductor portion on the base substrate is located between an orthographic projection of the second scanning line on the base substrate and an orthographic projections of the gate electrode of the driving transistor on the base substrate;

a gate electrode of the data writing-in transistor is coupled to a corresponding second scanning line, a first electrode of the data writing-in transistor is coupled to a corresponding data line, and a second electrode of the data writing-in transistor is coupled to the first electrode of the driving transistor;

at least part of the second scanning line is arranged around one end of the first conductive connection portion.

19. The display substrate according to claim 18, wherein the display substrate further includes a power line; the sub-pixel driving circuit further includes a storage capacitor, a first electrode plate of the storage capacitor is coupled to the gate electrode of the driving transistor, and a second electrode plate of the storage capacitor is coupled to the corresponding power line; an orthographic projection of the second electrode plate on the base substrate at least partially overlaps an orthographic projection of the first conductor portion on the base substrate; and/or, the orthographic projection of the first conductor portion on the base substrate at least partially overlaps an orthographic projection of the first conductive connection portion on the base substrate.

20. The display substrate according to claim 18, wherein the display substrate further includes a power line; the sub-pixel driving circuit further includes a storage capacitor, a first electrode plate of the storage capacitor is coupled to the gate electrode of the driving transistor, and a second electrode plate of the storage capacitor is coupled to the corresponding power line; an orthographic projection of the second electrode plate on the base substrate at least partially overlaps an orthographic projection of the first conductor portion on the base substrate; and/or, the orthographic projection of the first conductor portion on the base substrate does not overlap an orthographic projection of the first conductive connection portion on the base substrate; and/or, the orthographic projection of the first conductor portion on the base substrate at least partially overlaps an orthographic projection of the power line on the base substrate.

* * * * *